US011073309B2

(12) United States Patent
Seki

(10) Patent No.: US 11,073,309 B2
(45) Date of Patent: Jul. 27, 2021

(54) TEMPERATURE CONTROL DEVICE

(71) Applicant: SHINWA CONTROLS CO., LTD., Kawasaki (JP)

(72) Inventor: Atsushi Seki, Kawasaki (JP)

(73) Assignee: SHINWA CONTROLS CO., LTD., Kawasaki (JP)

( * ) Notice: Subject to any disclaimer, the term of this patent is extended or adjusted under 35 U.S.C. 154(b) by 95 days.

(21) Appl. No.: 16/622,154

(22) PCT Filed: Jul. 20, 2018

(86) PCT No.: PCT/JP2018/027330
§ 371 (c)(1),
(2) Date: Dec. 12, 2019

(87) PCT Pub. No.: WO2019/021968
PCT Pub. Date: Jan. 31, 2019

(65) Prior Publication Data
US 2020/0132344 A1    Apr. 30, 2020

(30) Foreign Application Priority Data

Jul. 24, 2017  (JP) .............................. JP2017-143038

(51) Int. Cl.
*F16K 11/00* (2006.01)
*F25B 21/04* (2006.01)
*H01L 21/683* (2006.01)

(52) U.S. Cl.
CPC .............. *F25B 21/04* (2013.01); *F16K 11/00* (2013.01); *H01L 21/6833* (2013.01)

(58) Field of Classification Search
CPC ...... F25B 21/04; H01L 21/6833; F16K 11/00; F16K 11/072; F16K 11/06; F16K 11/02; F16K 11/074; F16K 31/002
See application file for complete search history.

(56) References Cited

U.S. PATENT DOCUMENTS 3,556,201 A * 1/1971 Sander .................. B29C 35/007
165/253
3,749,357 A    7/1973 Fowler
(Continued)

FOREIGN PATENT DOCUMENTS

EP    3330582 A1    6/2018
JP    50-49736 A    5/1975
(Continued)

OTHER PUBLICATIONS

International Preliminary Report on Patentability and English translation of the Written Opinion of the International Searching Authority, dated Feb. 6, 2020, for International Application No. PCT/JP2018/027330.

(Continued)

*Primary Examiner* — Jianying C Atkisson
*Assistant Examiner* — Miguel A Diaz
(74) *Attorney, Agent, or Firm* — Birch, Stewart, Kolasch & Birch, LLP

(57) ABSTRACT

Control temperatures for a temperature control target are controlled in a plurality of steps. A lower temperature fluid supplied from first supply means (101) and a higher temperature fluid supplied from second supply means (102) are mixed together in a first three-way valve (103) for flow rate control to form a fluid for temperature control, and the fluid for temperature control is fed to the temperature control target. The fluid for temperature control returned from the temperature control target is distributed by a second three-way valve (108) for flow rate control so as to be returned to the first supply means and the second supply means. The lower temperature fluid prevented from being supplied from the first supply means to the first three-way valve for flow rate control is returned to the first supply means by a third three-way valve (112) for flow rate control through a bypass (Continued)

flow passage together with the fluid for temperature control distributed by the second three-way valve for flow rate control. Meanwhile, the higher temperature fluid prevented from being supplied from the second supply means to the first three-way valve for flow rate control is returned to the second supply means by a fourth three-way valve (116) for flow rate control through a bypass flow passage together with the fluid for temperature control distributed by the second three-way valve for flow rate control.

4 Claims, 26 Drawing Sheets

(56) References Cited

U.S. PATENT DOCUMENTS

| | | | | |
|---|---|---|---|---|
| 3,776,506 | A * | 12/1973 | Fowler | F16K 5/205 |
| | | | | 251/172 |
| 3,848,849 | A | 11/1974 | Alexander | |
| 5,983,937 | A * | 11/1999 | Makihara | B60H 1/00485 |
| | | | | 137/624.15 |
| 6,250,559 | B1 * | 6/2001 | Knauss | G05D 23/1346 |
| | | | | 236/12.2 |
| 8,733,666 | B2 * | 5/2014 | Beagen | F16K 31/002 |
| | | | | 236/12.11 |
| 9,062,787 | B2 * | 6/2015 | Morimoto | F16K 11/085 |
| 9,134,737 | B2 * | 9/2015 | Menet | G05D 23/134 |
| 9,504,970 | B2 * | 11/2016 | Baker | B01F 5/008 |
| 9,520,308 | B2 * | 12/2016 | Han | H01L 21/67248 |
| 10,163,665 | B2 * | 12/2018 | Han | H01L 21/6831 |
| 10,215,293 | B2 * | 2/2019 | Hiraoka | H01L 23/473 |
| 10,352,463 | B2 * | 7/2019 | Forrestal | G05D 23/1346 |
| 10,989,319 | B2 * | 4/2021 | Kusumoto | F16K 5/0464 |
| 2005/0127193 | A1 * | 6/2005 | Taylor | G05D 23/134 |
| | | | | 236/12.15 |
| 2006/0090798 | A1 * | 5/2006 | Beagen | G05D 23/134 |
| | | | | 137/602 |
| 2008/0093469 | A1 * | 4/2008 | Kline | F16K 15/025 |
| | | | | 236/12.2 |
| 2008/0289811 | A1 * | 11/2008 | Kariya | G05D 23/1393 |
| | | | | 165/300 |
| 2010/0123014 | A1 * | 5/2010 | Beagen | G05D 23/1346 |
| | | | | 236/12.2 |
| 2011/0220288 | A1 | 9/2011 | Kobayashi et al. | |
| 2012/0006436 | A1 * | 1/2012 | Morimoto | F16K 11/085 |
| | | | | 137/625 |
| 2014/0073066 | A1 | 3/2014 | Tabuchi | |
| 2015/0107268 | A1 | 4/2015 | Han et al. | |
| 2016/0172219 | A1 * | 6/2016 | Han | H01L 21/67248 |
| | | | | 62/3.2 |
| 2017/0092471 | A1 | 3/2017 | Wakai | |
| 2018/0222289 | A1 * | 8/2018 | Kawakubo | B60H 1/00485 |
| 2018/0283565 | A1 * | 10/2018 | Tanaka | F25B 41/31 |
| 2018/0328501 | A1 * | 11/2018 | Hiraoka | F16K 11/085 |
| 2020/0124187 | A1 * | 4/2020 | Hiraoka | F16K 31/041 |
| 2020/0132344 | A1 * | 4/2020 | Seki | H01L 21/67109 |
| 2020/0173565 | A1 * | 6/2020 | Kusumoto | F16K 11/085 |
| 2020/0378515 | A1 * | 12/2020 | Ono | F16K 31/002 |
| 2020/0378517 | A1 * | 12/2020 | Weiss | F16K 31/042 |

FOREIGN PATENT DOCUMENTS

| | | |
|---|---|---|
| JP | 6-174388 A | 6/1994 |
| JP | 7-190217 A | 7/1995 |
| JP | 2011-187758 A | 9/2011 |
| JP | 2014-63972 A | 4/2014 |
| JP | 2015-79930 A | 4/2015 |
| JP | 2017-63088 A | 3/2017 |
| JP | 6104443 B1 | 3/2017 |

OTHER PUBLICATIONS

International Search Report, issued in PCT/JP2018/027330, PCT/ISA/210, dated Sep. 18, 2018.
Written Opinion of the International Searching Authority, issued in PCT/JP2018/027330, PCT/ISA/237, dated Sep. 18, 2018.

* cited by examiner (a)

(b)

(a)

FLOW OF FLUID (b)

FLOW OF FLUID (a)

(b)

(a)

OPENING DEGREES 0~50%

(b)

OPENING DEGREES 50~100%

TEMPERATURE CONTROL DEVICE

TECHNICAL FIELD

The present invention relates to a temperature control device.

BACKGROUND ART

Hitherto, as a technology relating to a temperature control device, there has already been proposed, for example, a temperature control device disclosed in Patent Literature 1.

The invention of Patent Literature 1 has a main object to provide a temperature control system for a semiconductor manufacturing system capable of minimizing power consumption for cooling or heating. The temperature control system is configured to control cooling and heating of a heating medium (coolant) recovered from a load of a semiconductor manufacturing system to supply the heating medium at a target temperature, and the temperature control system for a semiconductor manufacturing system includes: a mixer configured to mix a low temperature heating medium and a high temperature heating medium to supply the mixed heating medium to a load; a first heating medium tank configured to store the low temperature heating medium; a first thermoelectric element block configured to cool the heating medium and provide the heating medium of the first heating medium tank; a second thermoelectric element block configured to cool the recovered heating medium to provide the recovered heating medium to the first heating medium tank; a first 3-way switching valve configured to provide the cooled heating medium in the first heating medium tank, which is provided through the first thermoelectric element block, to the mixer at a first ratio and bypass the remaining heating medium to the second thermoelectric element block to recover the remaining heating medium in the first heating medium tank; a second heating medium tank configured to store the high temperature heating medium; a first heater configured to heat the heating medium in the second heating medium tank; a second heater configured to heat the recovered heating medium and provide the recovered heating medium to the second heating medium tank; a second 3-way switching valve configured to provide the heating medium in the second heating medium tank, which is heated through the first heater, to the mixer at a second ratio and bypass the remaining heating medium to the second heater to recover the remaining heating medium in the second heating medium tank; and a third 3-way switching valve configured to provide the heating medium, which is recovered from the load, to the second thermoelectric element block at the first ratio and provide the heating medium to the second heater at the second ratio.

CITATION LIST

Patent Literature

[PTL 1] JP 2015-79930 A

SUMMARY OF INVENTION

Technical Problem

The present invention has an object to provide a temperature control device capable of controlling a mixture ratio between a lower temperature fluid and a higher temperature fluid with high accuracy and controlling control temperatures for a temperature control target in a plurality of steps, as compared to a configuration incapable of independently controlling a mixture ratio between the lower temperature fluid supplied from first supply means and the higher temperature fluid supplied from the second supply means and a distribution ratio between the lower temperature fluid returned to the first supply means and the higher temperature fluid returned to the second supply means.

Solution to Problem

According to the invention of claim 1, provided is a temperature control device, including: first supply means for supplying a lower temperature fluid adjusted to a first predetermined lower temperature; second supply means for supplying a higher temperature fluid adjusted to a second predetermined higher temperature; a first three-way valve for flow rate control configured to mix the lower temperature fluid supplied from the first supply means and the higher temperature fluid supplied from the second supply means while controlling a flow rate of the lower temperature fluid and a flow rate of the higher temperature fluid to form a fluid for temperature control and then supply the fluid for temperature control to a temperature control target; a second three-way valve for flow rate control configured to distribute the fluid for temperature control having flowed through the temperature control target to the first supply means and the second supply means while controlling a flow rate of the fluid for temperature control; a third three-way valve for flow rate control configured to control the flow rate of the fluid for temperature control, which flows through the temperature control target and is distributed by the second three-way valve for flow rate control to the first supply means, and the flow rate of the lower temperature fluid, which is prevented from being supplied from the first supply means to the first three-way valve for flow rate control and is returned to the first supply means; and a fourth three-way valve for flow rate control configured to control the flow rate of the fluid for temperature control, which flows through the temperature control target and is distributed by the second three-way valve for flow rate control to the second supply means, and the flow rate of the higher temperature fluid, which is prevented from being supplied from the second supply means to the first three-way valve for flow rate control and is returned to the second supply means.

According to the invention of claim 2, in the temperature control device as described in claim 1, the first supply means includes: first cooling means for cooling the fluid for temperature control returned to the first supply means; first heating means for heating in an auxiliary manner the fluid for temperature control cooled by the first cooling means, and supplying the fluid for temperature control as the lower temperature fluid; and a first storage tank configured to store the lower temperature fluid heated in an auxiliary manner by the first heating means.

According to the invention of claim 3, in the temperature control device as described in claim 1 or 2, the second supply means includes: second cooling means for cooling the fluid for temperature control returned to the second supply means; second heating means for heating in an auxiliary manner the fluid for temperature control cooled by the second cooling means, and supplying the fluid for temperature control as the higher temperature fluid; and a second storage tank configured to store the higher temperature fluid heated in an auxiliary manner by the second heating means.

According to the invention of claim 4, in the temperature control device as described in claim 1 or 2, in accordance with a mixture ratio in the first three-way valve for flow rate control, the third three-way valve for flow rate control increases a ratio of the lower temperature fluid to be supplied from the first supply means and returned to the first supply means, and the fourth three-way valve for flow rate control increases a ratio of the higher temperature fluid to be supplied from the second supply means and returned to the second supply means.

According to the invention of claim 5, in the temperature control device as described in claim 1 or 2, the first to fourth three-way valves for flow rate control each include: a valve main body including a valve seat, the valve seat having a columnar space and having an inflow port, which allows inflow of the fluid for temperature control having flowed through the flow passage for temperature control, a first valve port, which allows outflow of a part of the fluid for temperature control distributed to the first supply means and has a rectangular cross section, and a second valve port, which allows outflow of a part of the fluid for temperature control distributed to the second supply means and has a rectangular cross section; a valve body being provided in a freely rotatable manner in the valve seat of the valve main body so as to simultaneously switch the first valve port from a closed state to an opened state and switch the second valve port from an opened state to a closed state, the valve body having a half-cylindrical shape with a predetermined central angle and having a curved-surface shape or a flat-surface shape at each of both end surfaces of the valve body in a circumferential direction; and drive means for driving the valve body to rotate.

According to the invention of claim 6, in the temperature control device as described in claim 1 or 2, the first to fourth three-way valves for flow rate control each include: a valve main body including a valve seat, the valve seat having a columnar space and having a first valve port, which allows outflow of a fluid and has a rectangular cross section, and a second valve port, which allows outflow of the fluid and has a rectangular cross section; first and second valve port forming members, which are fitted to the valve main body and form the first valve port and the second valve port, respectively; a valve body being provided in a freely rotatable manner in the valve seat of the valve main body so as to simultaneously switch the first valve port from a closed state to an opened state and switch the second valve port from an opened state to a closed state, the valve body having a cylindrical shape and having an opening; a pressure applying portion configured to apply a pressure of the fluid leaking through a gap between the valve body and the valve seat to the first and second valve port forming members so as to suppress shift of a position of the valve body when the valve body opens and closes the first valve port and the second valve port; and drive means for driving the valve body to rotate.

Advantageous Effects of Invention

According to the present invention, the temperature control device capable of controlling the mixture ratio between the lower temperature fluid and the higher temperature fluid with high accuracy and controlling control temperatures for the temperature control target in the plurality of steps as compared to the configuration incapable of independently controlling the mixture ratio between the lower temperature fluid supplied from the first supply means and the higher temperature fluid supplied from the second supply means and the distribution ratio between the lower temperature fluid returned to the first supply means and the higher temperature fluid returned to the second supply means can be provided.

DESCRIPTION OF EMBODIMENTS

In the following, embodiments of the present invention are described with reference to the drawings.

First Embodiment

<Schematic Configuration of Chiller Device>

Figure 1:
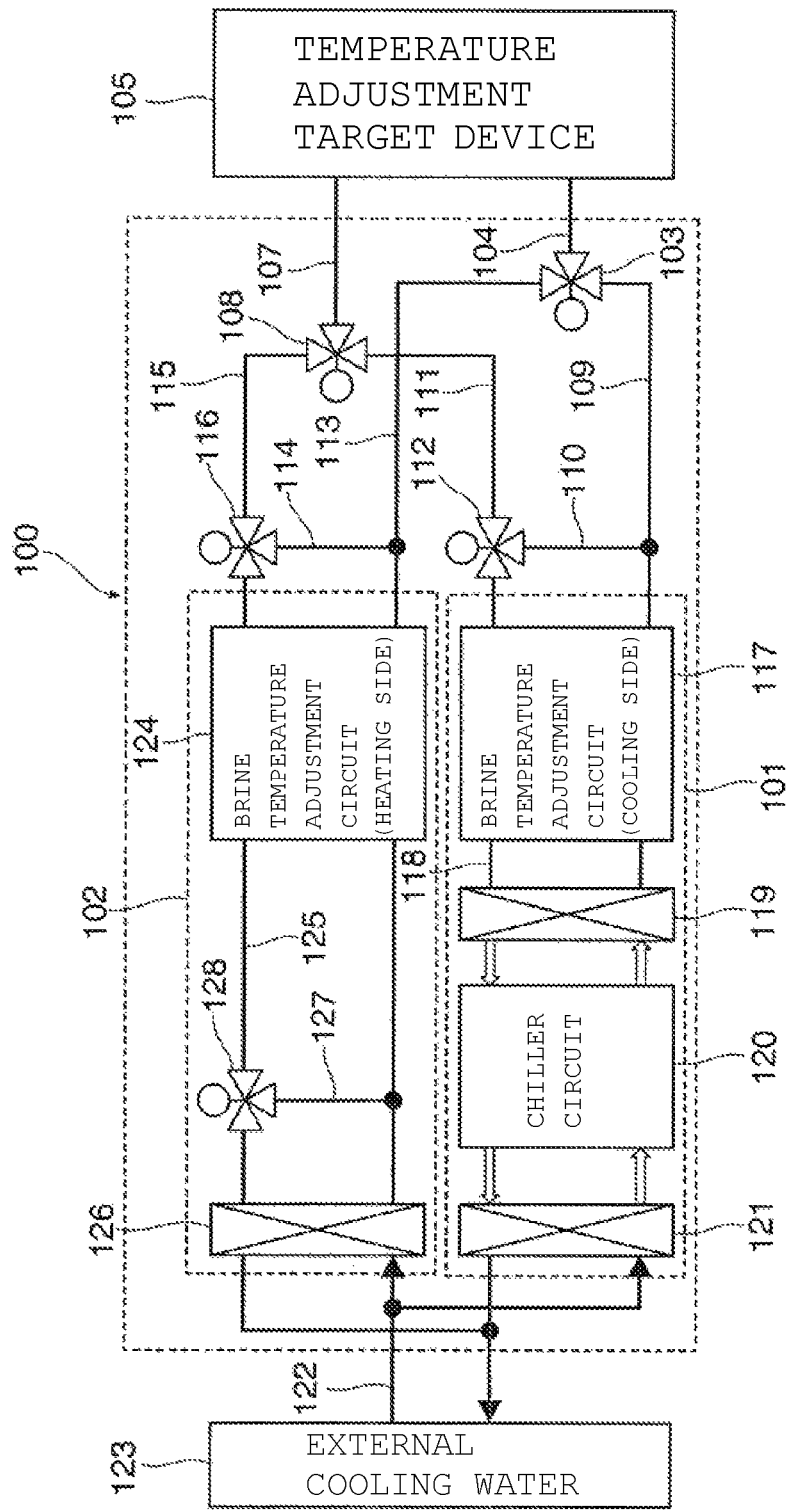
FIG. 1 is a schematic configuration diagram for illustrating a constant-temperature maintaining device (chiller device) as a temperature control device according to a first embodiment of the present invention.

FIG. 1 is a schematic configuration diagram for illustrating a constant-temperature maintaining device (chiller device) as one example of a temperature control device according to a first embodiment of the present invention, which is capable of performing temperature control in a plurality of steps.

A chiller device 100 is used for, for example, a semiconductor manufacturing apparatus involving plasma etching as described later, and is configured to perform control so as to maintain, for example, a temperature of a semiconductor wafer as one example of a temperature control target (workpiece) W to a constant temperature in the plurality of steps.

As illustrated in FIG. 1, the chiller device 100 includes a lower temperature fluid supply portion 101 and a higher temperature fluid supply portion 102. The lower temperature fluid supply portion 101 is one example of first supply means for supplying a lower temperature fluid adjusted to a predetermined constant lower temperature. The higher temperature fluid supply portion 102 is one example of second supply means for supplying a higher temperature fluid adjusted to a predetermined constant higher temperature. The lower temperature fluid supplied from the lower temperature fluid supply portion 101 and the higher temperature fluid supplied from the higher temperature fluid supply portion 102 are mixed under a state in which a mixture ratio between the lower temperature fluid and the higher temperature fluid is adjusted through a first three-way valve 103 for flow rate control to form a fluid for temperature control, and then the fluid for temperature control is fed through a supply pipe 104 to a temperature adjustment target device 105 being one example of temperature control means formed of, for example, an electrostatic chuck (ESC) configured to hold the temperature control target (workpiece) W.

The temperature adjustment target device 105 has a flow passage 106 for temperature control (see FIG. 2) therein. The fluid for temperature control, which is obtained by mixing the lower temperature fluid and the higher temperature fluid at a desired mixture ratio and adjusting the mixture to a desired temperature, flows through the flow passage 106 for temperature control. On an outflow side of the flow passage 106 for temperature control, a second three-way valve 108 for flow rate control is provided. The second three-way valve 108 for flow rate control is configured to distribute the fluid for temperature control, which has flowed through the flow passage 106 for temperature control, to the lower temperature fluid supply portion 101 and the higher temperature fluid supply portion 102 through a return pipe 107 at a desired ratio (distribution ratio).

The lower temperature fluid supply portion 101 includes a first bypass pipe 110. Of the lower temperature fluid supplied from the lower temperature fluid supply portion 101 to the first three-way valve 103 for flow rate control through a lower-temperature-side mixing pipe 109, a part of the lower temperature fluid prevented from being supplied to the first three-way valve 103 for flow rate control is returned to the lower temperature fluid supply portion 101 through the first bypass pipe 110. On a return side of the lower temperature fluid supply portion 101, a third three-way valve 112 for flow rate control is provided. The third three-way valve 112 for flow rate control is configured to control a flow rate of the fluid for temperature control, which flows through the flow passage 106 for temperature control and is distributed by the second three-way valve 108 for flow rate control to the lower temperature fluid supply portion 101 through a lower-temperature-side distributing pipe 111, and a flow rate of the lower temperature fluid, which is prevented from being supplied from the lower temperature fluid supply portion 101 to the first three-way valve 103 for flow rate control and is returned to the lower temperature fluid supply portion 101 through the first bypass pipe 110.

Meanwhile, the higher temperature fluid supply portion 102 includes a second bypass pipe 114. Of the higher temperature fluid supplied from the higher temperature fluid supply portion 102 to the first three-way valve 103 for flow rate control through a higher-temperature-side mixing pipe 113, a part of the higher temperature fluid prevented from being supplied to the first three-way valve 103 for flow rate control is returned to the higher temperature fluid supply portion 102 through the second bypass pipe 114. On a return side of the higher temperature fluid supply portion 102, a fourth three-way valve 116 for flow rate control is provided. The fourth three-way valve 116 for flow rate control is configured to control a flow rate of the fluid for temperature control, which flows through the flow passage 106 for temperature control and is distributed by the second three-way valve 108 for flow rate control to the higher temperature fluid supply portion 102 through a higher-temperature-side distributing pipe 115, and a flow rate of the higher temperature fluid, which is prevented from being supplied from the higher temperature fluid supply portion 102 to the first three-way valve 103 for flow rate control and is returned to the higher temperature fluid supply portion 102 through the second bypass pipe 114. As the lower temperature fluid and the higher temperature fluid, the same heating medium (hereinafter, referred to as "brine") is used.

As illustrated in FIG. 1, the lower temperature fluid supply portion 101 includes a cooling-side brine temperature adjustment circuit 117 configured to adjust the brine to a predetermined constant lower temperature. A secondary side of an evaporator 119 is connected to the cooling-side brine temperature adjustment circuit 117 through intermediation of a lower-temperature-side circulating pipe 118. A chiller circuit 120 is connected to a primary side of the evaporator 119. The chiller circuit 120 is configured to cool the brine, which flows through the secondary side of the evaporator 119, to a desired temperature. The chiller circuit 120 cools the brine flowing through the secondary side of the evaporator 119 to the desired temperature by expanding the heating medium condensed by a condenser 121 and feeding the heating medium to the primary side of the evaporator 119. Further, the brine flowing through the chiller circuit 120 is condensed by the condenser 121. External cooling water 123 is supplied to the condenser 121 through a cooling water pipe 122.

Further, the higher temperature fluid supply portion 102 includes a heating-side brine temperature adjustment circuit 124 configured to adjust the brine to a predetermined constant higher temperature. A heat exchanger 126 is connected to the heating-side brine temperature adjustment circuit 124 through intermediation of a higher-temperature-side circulating pipe 125. A third bypass pipe 127 is connected between the heating-side brine temperature adjustment circuit 124 and the heat exchanger 126. The third bypass pipe 127 allows the heating medium flowing from the heating-side brine temperature adjustment circuit 124 to the heat exchanger 126 to flow to the heating-side brine temperature adjustment circuit 124. Further, on an inflow side of the third bypass pipe 127, a fifth three-way valve 128 for flow rate control is provided. The fifth three-way valve 128 for flow rate control is configured to control a flow rate of the fluid for temperature control supplied to the heat exchanger 126 and a flow rate of the fluid for temperature control caused to bypass the heat exchanger 126 and returned to the heating-side brine temperature adjustment circuit 124. The external cooling water 123 is supplied to the heat exchanger 126 through the cooling water pipe 122. The heat exchanger 126 cools the brine. For example, when a temperature of the higher temperature fluid flowing through the higher-temperature-side circulating pipe 125 is equal to or lower than a predetermined threshold value, the fifth three-way valve 128 for flow rate control adjusts an opening degree so as to return a part or entirety of the higher temperature fluid flowing through the higher-temperature-side circulating pipe 125 directly to the heating-side brine temperature adjustment circuit 124.

<Basic Operation of Chiller Device>

The chiller device 100 basically operates as follows.

Figure 3:
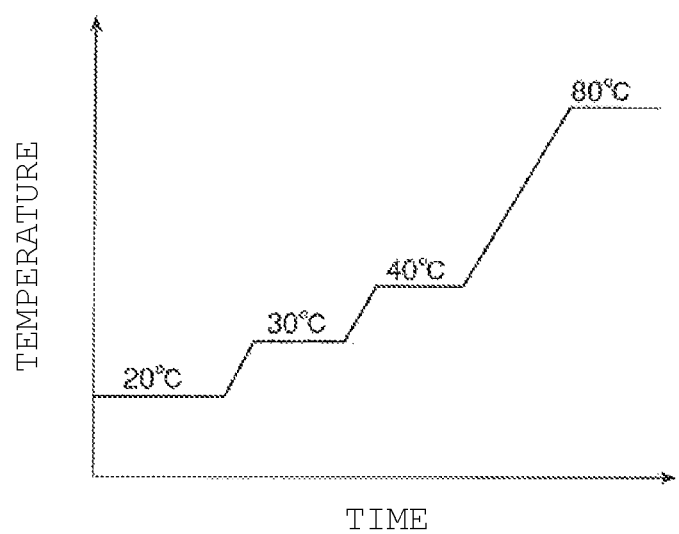
FIG. 3 is a graph for showing control temperatures to be controlled by the chiller device.

As illustrated in FIG. 3, the chiller device 100 controls a temperature of the fluid for temperature control to be supplied to the temperature adjustment target device 105 to, for example, 20° C., 30° C., 40° C., and 80° C. in the plurality of steps in a stepwise manner. Here, the temperature of the lower temperature fluid supplied from the lower temperature fluid supply portion 101 is set to, for example, about 20° C., which is equal to the lowest temperature among control temperatures in the plurality of steps. Further, the temperature of the higher temperature fluid supplied from the higher temperature fluid supply portion 102 is set to, for example, about 80° C., which is equal to the highest temperature among the control temperatures in the plurality of steps. However, in the embodiment of the present invention, the temperature of the lower temperature fluid and the temperature of the higher temperature fluid are not limited to the lowest temperature and the highest temperature among the control temperatures in the plurality of steps. As a matter of course, the temperature of the lower temperature fluid and the temperature of the higher temperature fluid may be set to freely selected temperatures, for example, a temperature lower than the lowest temperature or the highest temperature among the control temperatures in the plurality of steps.

Figure 4:
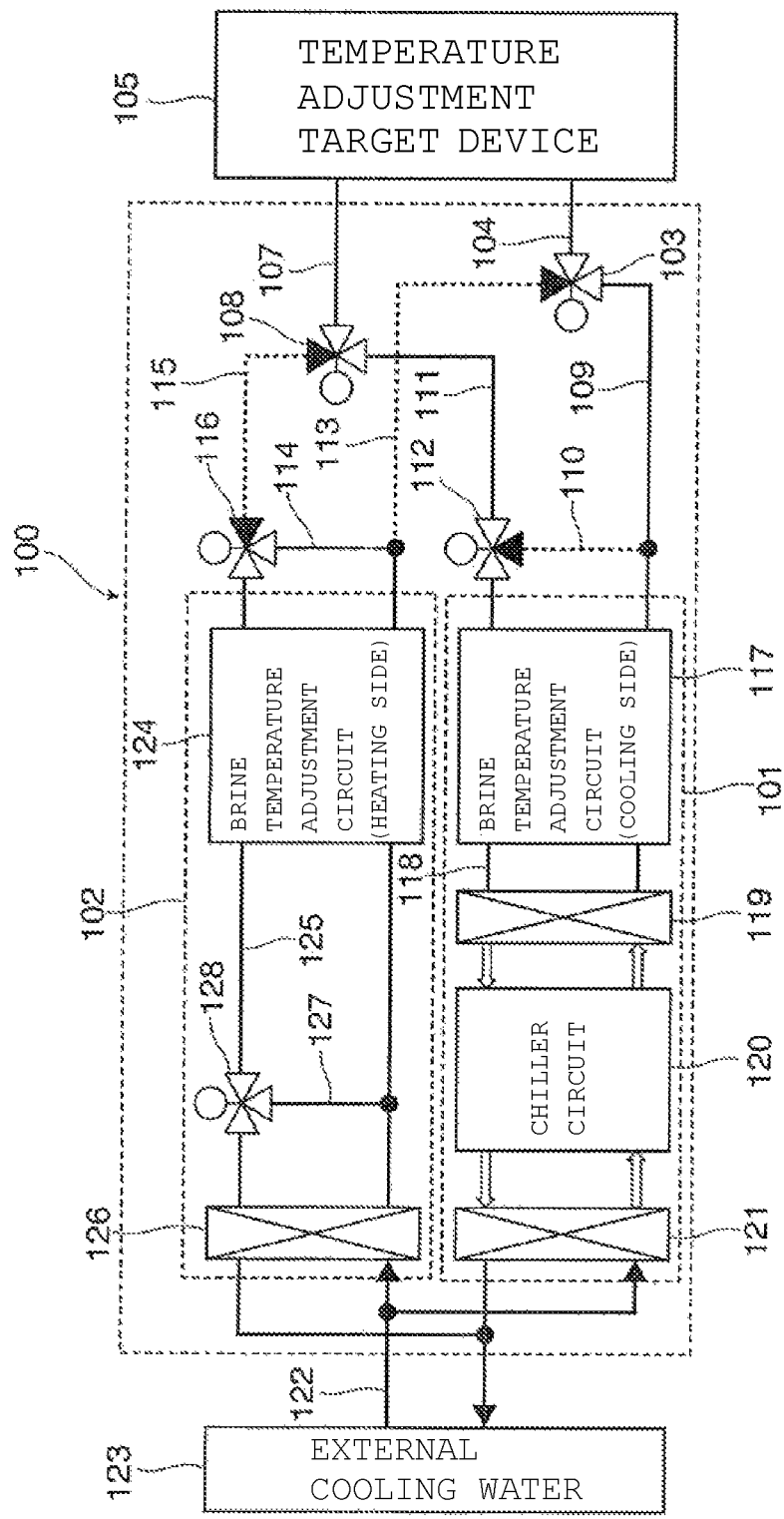
FIG. 4 is a schematic configuration diagram for illustrating operation of the constant-temperature maintaining device (chiller device) as the temperature control device according to the first embodiment of the present invention.

As illustrated in FIG. 4, when the chiller device 100 controls the temperature of the fluid for temperature control to 20° C., which is the lowest temperature among the control temperatures in the plurality of steps, the chiller device 100 interrupts the higher temperature fluid flowing into the first three-way valve 103 for flow rate control through the higher-temperature-side mixing pipe 113 so as to set the flow rate of the higher temperature fluid to zero, and releases the lower temperature fluid flowing into the first three-way valve 103 for flow rate control through the lower-temperature-side mixing pipe 109 so as to set the flow rate of the lower temperature fluid to 100%. Further, the chiller device 100 interrupts the higher temperature fluid distributed from the second three-way valve 108 for flow rate control to the higher temperature fluid supply portion 102 through the higher-temperature-side distributing pipe 115 so as to set the distribution amount of the higher temperature fluid to zero, and releases the lower temperature fluid distributed from the second three-way valve 108 for flow rate control to the lower temperature fluid supply portion 101 through the lower-temperature-side distributing pipe 111 so as to set the distribution amount of the lower temperature fluid to 100%. Along with this, the chiller device 100 releases the higher temperature fluid returned by the fourth three-way valve 116 for flow rate control to the higher temperature fluid supply portion 102 through the second bypass pipe 114, and returns all the higher temperature fluid supplied from the higher temperature fluid supply portion 102 to the higher temperature fluid supply portion 102. Further, the chiller device 100 interrupts the lower temperature fluid returned by the third three-way valve 112 for flow rate control to the lower temperature fluid supply portion 101 through the first bypass pipe 110, and supplies all the lower temperature fluid supplied from the lower temperature fluid supply portion 101 to the first three-way valve 103 for flow rate control.

As a result, the fluid for temperature control adjusted in temperature to 20° C. is supplied from the lower temperature fluid supply portion 101 to the flow passage 106 for temperature control of the temperature adjustment target device 105, and the temperature of the temperature adjustment target device 105 is controlled to 20° C., which is the temperature of the fluid for temperature control including only the lower temperature fluid.

Figure 5:
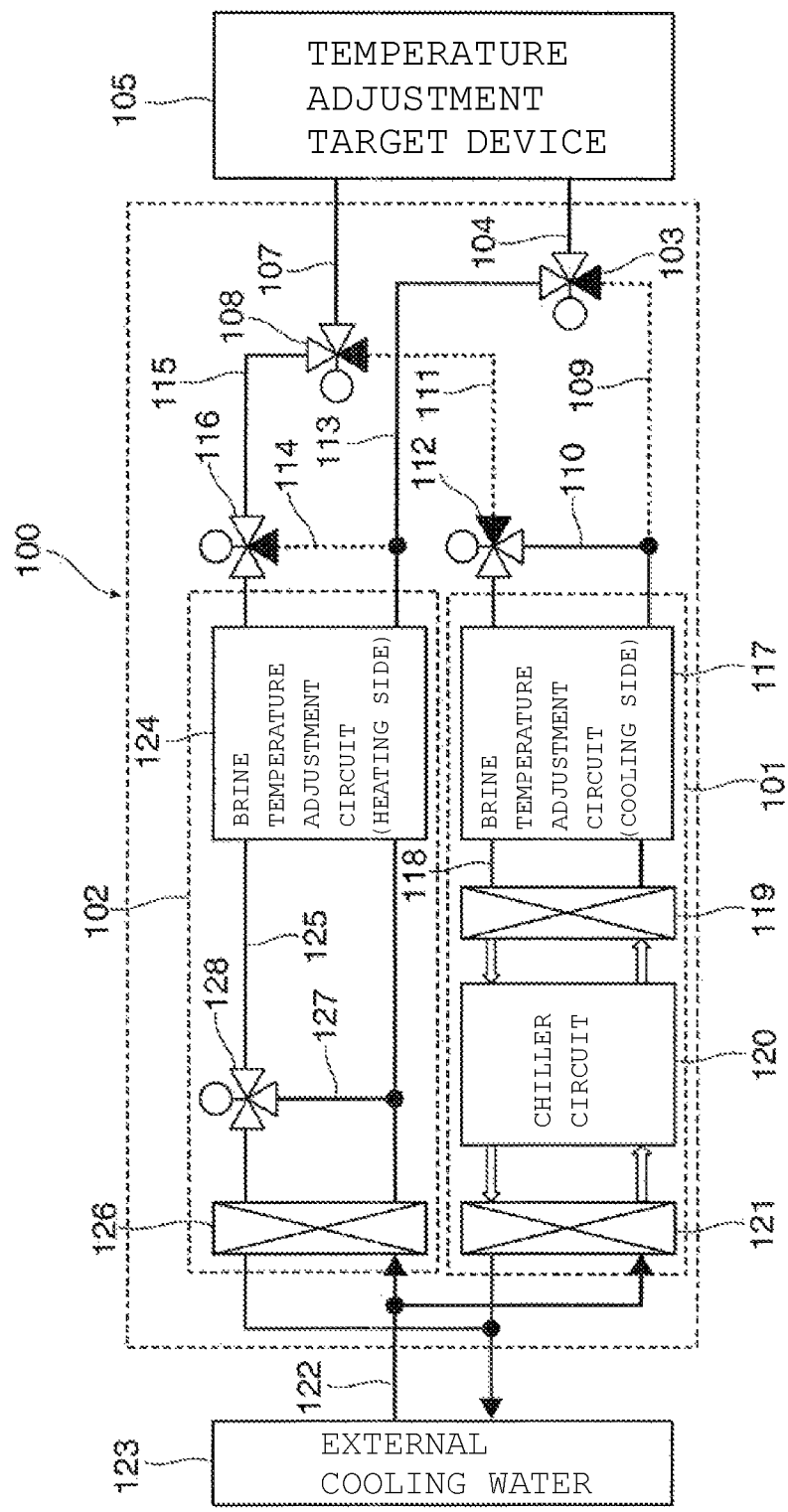
FIG. 5 is a schematic configuration diagram for illustrating the operation of the constant-temperature maintaining device (chiller device) as the temperature control device according to the first embodiment of the present invention.

Further, as illustrated in FIG. 5, when the chiller device 100 controls the temperature of the fluid for temperature control to 80° C., which is the highest temperature among the control temperatures in the plurality of steps, the chiller device 100 releases the higher temperature fluid flowing into the first three-way valve 103 for flow rate control through the higher-temperature-side mixing pipe 113 so as to set the flow rate of the lower temperature fluid to 100%, and interrupts the lower temperature fluid flowing into the first three-way valve 103 for flow rate control through the lower-temperature-side mixing pipe 109 so as to set the flow rate of the higher temperature fluid to zero. Further, the chiller device 100 releases the higher temperature fluid distributed from the second three-way valve 108 for flow rate control to the higher temperature fluid supply portion 102 through the higher-temperature-side distributing pipe 115 so as to set the distribution amount of the higher temperature fluid to zero, and interrupts the lower temperature fluid distributed from the second three-way valve 108 for flow rate control to the lower-temperature fluid supply portion 101 through the lower-temperature-side distributing pipe 111 so as to set the distribution amount of the lower temperature fluid to zero. Along with this, the chiller device 100 interrupts the higher temperature fluid returned by the fourth three-way valve 116 for flow rate control to the higher temperature fluid supply portion 102 through the second bypass pipe 114, and supplies all the higher temperature fluid supplied from the higher temperature fluid supply portion 102 to the first three-way valve 103 for flow rate control. Further, the chiller device 100 releases the lower temperature fluid returned by the third three-way valve 112 for flow rate control to the lower temperature fluid supply portion 101 through the first bypass pipe 110, and returns all the lower temperature fluid supplied from the lower temperature fluid supply portion 101 to the lower temperature fluid supply portion 101.

As a result, the fluid for temperature control adjusted in temperature to 80° C. is supplied from the higher temperature fluid supply portion 102 to the flow passage 106 for temperature control of the temperature adjustment target device 105, and the temperature of the temperature adjustment target device 105 is controlled to 80° C., which is the temperature of the fluid for temperature control including only the higher temperature fluid.

Moreover, as illustrated in FIG. 1, when the chiller device 100 controls the temperature of the fluid for temperature control to 30° C. or 40° C. being an intermediate temperature among the control temperatures in the plurality of steps, the chiller device 100 adjusts the opening degree of the first three-way valve 103 for flow rate control in accordance with the intermediate temperature being a target temperature for the temperature adjustment target device 105, and controls, to a desired value, the mixture ratio between the lower temperature fluid supplied from the lower temperature fluid supply portion 101 through the lower-temperature-side mixing pipe 109 and the higher temperature fluid supplied from the higher temperature fluid supply portion 102 through the higher-temperature-side mixing pipe 113. From the chiller device 100, the fluid for temperature control, which includes the lower temperature fluid and the higher temperature fluid mixed together in accordance with the opening degree of the first three-way valve 103 for flow rate control, is supplied to the flow passage 106 for temperature control of the temperature adjustment target device 105. Further, the chiller device 100 adjusts the opening degree of the second three-way valve 108 for flow rate control, and controls the distribution ratio between the lower temperature fluid and the higher temperature fluid distributed to the lower temperature fluid supply portion 101 and the higher temperature fluid supply portion 102 in accordance with the mixture ratio between the lower temperature fluid and the higher temperature fluid mixed together in the first three-way valve 103 for flow rate control.

For example, when the mixture ratio between the lower temperature fluid and the higher temperature fluid in the first three-way valve 103 for flow rate control is 4:6, the opening degree of the second three-way valve 108 for flow rate control is controlled so that the same distribution ratio of 4:6 is obtained between the lower temperature fluid and the higher temperature fluid, and the second three-way valve 108 for flow rate control distributes the fluid for temperature control with such ratio to the lower temperature fluid supply portion 101 and the higher temperature fluid supply portion 102.

Along with this, the chiller device 100 controls the flow rate of the higher temperature fluid returned by the fourth three-way valve 116 for flow rate control to the higher temperature fluid supply portion 102 through the second bypass pipe 114, and thus returns the remaining higher temperature fluid, which is supplied from the higher temperature fluid supply portion 102 to the first three-way valve 103 for flow rate control, to the higher temperature fluid supply portion 102. Similarly, the chiller device 100 controls the flow rate of the lower temperature fluid returned by the third three-way valve 112 for flow rate control to the lower temperature fluid supply portion 101 through the first bypass pipe 110, and thus returns the remaining lower temperature fluid, which is supplied from the lower temperature fluid supply portion 101 to the first three-way valve 103 for flow rate control, to the lower temperature fluid supply portion 101.

In the above-mentioned example, for example, when the mixture ratio between the lower temperature fluid and the higher temperature fluid in the first three-way valve 103 for flow rate control is 4:6, the fourth three-way valve 116 for flow rate control controls a ratio (flow rate ratio) between the higher temperature fluid returned to the higher temperature fluid supply portion 102 through the second bypass pipe 114 and the fluid for temperature control distributed by the second three-way valve 108 for flow rate control to the higher temperature fluid supply portion 102 to 4:6.

Similarly, in the above-mentioned example, for example, when the mixture ratio between the lower temperature fluid and the higher temperature fluid in the first three-way valve 103 for flow rate control is 4:6, the third three-way valve 112 for flow rate control controls a ratio (flow rate ratio) between the lower temperature fluid returned to the lower temperature fluid supply portion 101 through the first bypass pipe 110 and the fluid for temperature control distributed by the second three-way valve 108 for flow rate control to the lower temperature fluid supply portion 101 to 6:4.

As a result, the fluid for temperature control, which is obtained by mixing the lower temperature fluid supplied from the lower temperature fluid supply portion 101 and the higher temperature fluid supplied from the higher temperature fluid supply portion 102 in accordance with the opening degree of the first three-way valve 103 for flow rate control, is supplied to the flow passage 106 for temperature control of the temperature adjustment target device 105. Thus, a temperature of the temperature adjustment target device 105 is controlled to be equal to the temperature of the fluid for temperature control determined in accordance with the mixture ratio between the lower temperature fluid and the higher temperature fluid.

As described above, the chiller device 100 adjusts the temperature of the fluid for temperature control being a mixed fluid by controlling the mixture ratio between the lower temperature fluid supplied from the lower temperature fluid supply portion 101 and the higher temperature fluid supplied from the higher temperature fluid supply portion 102 through use of the first three-way valve 103 for flow rate control, and thus can control the temperature of the temperature adjustment target device 105, which includes the flow passage 106 for temperature control allowing the flow of the fluid for temperature control, in a desired temperature range (for example, range of from +20° C. to +80° C.) corresponding to a temperature range of the fluid for temperature control flowing through the temperature adjustment target device 105. The temperature range of the temperature adjustment target device 105 is not limited to the range of from +20° C. to +80° C., and the temperature of the temperature adjustment target device 105 may be controlled in a desired temperature range (for example, range of from −20° C. to +120° C.)

The lower temperature fluid supply portion 101 is configured to supply, for example, the lower temperature fluid set to −20° C. at a flow rate of 30 L/min under a pressure of 0.8 MPa. Further, the higher temperature fluid supply portion 102 is configured to supply, for example, the higher temperature fluid set to +120° C. at a flow rate of 30 L/min under a pressure of 0.8 MPa. The lower temperature fluid and the higher temperature fluid are the same fluid as described above. Examples of the heating medium (brine) used as the lower temperature fluid and the higher temperature fluid include fluids such as a fluorine-based inert liquid, for example, Fluorinert (3M Company: trademark) and ethylene glycol usable in a temperature range of from about −30° C. to about +120° C. However, when the temperature range is from about +20° C. to about +80° C., water (such as pure water) adjusted to a temperature of from about 0° C. to about 30° C. under a pressure of from 0 MPa to 1 MPa, and water (pure water) adjusted to a temperature of from about 50° C. to about 80° C. are suitably used as the lower temperature fluid and the higher temperature fluid, respectively.

<Configuration of Plasma Treatment Apparatus>

As the semiconductor manufacturing apparatus to which the chiller device 100 is applied, a plasma treatment apparatus 200 involving plasma treatment can be given.

Figure 2:
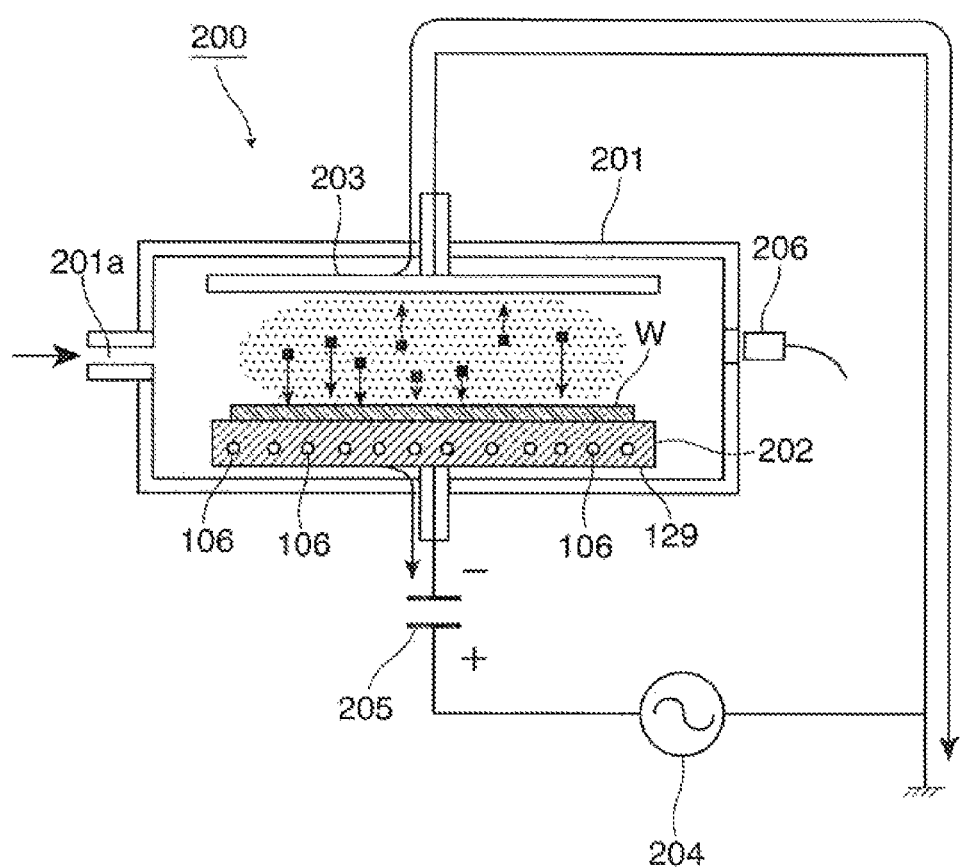
FIG. 2 is a sectional configuration view for illustrating a plasma treatment apparatus.

As illustrated in FIG. 2, the plasma treatment apparatus 200 includes a vacuum container (chamber) 201. Inside the vacuum container (chamber) 201, there is provided an electrostatic chuck (ESC) 129 as one example of the temperature control means for holding the semiconductor wafer W being the temperature control target under a state of electrostatically attracting the semiconductor wafer W. The flow passage 106 for temperature control, through which the fluid for temperature control flows from the chiller device 100, is formed in the electrostatic chuck 129. Further, the plasma treatment apparatus 200 includes a lower electrode (cathode electrode) 202 and an upper electrode (anode electrode) 203. The lower electrode 202 is also used as the electrostatic chuck 129, and is coupled to a lid portion. The upper electrode 203 is arranged to be opposed to the lower electrode 202, and integrally includes the lid portion.

Further, a gas intake port 201a is formed in the vacuum container 201, and is configured to introduce active gas (reactive gas) for etching therethrough. The upper electrode 203 is connected to a ground potential (GND) through intermediation of the lid portion extending outward. Further, the lower electrode 202 is connected to a radio-frequency (RF) oscillator 204 and a blocking capacitor 205 through intermediation of the lid portion extending outward. One end of the radio-frequency (RF) oscillator 204 is connected to the ground potential (GND). Moreover, a light emission detector 206 is provided on an outer side of a window portion formed in a wall of the vacuum container 201 opposed to the gas intake port 201a, and is configured to monitor a light emission state when plasma for etching is produced to perform etching by the plasma treatment.

Incidentally, under a state in which the active gas is ionized through the plasma treatment, positive ions of the active gas are attracted to the temperature control target W located on a side of the lower electrode 202 being the cathode electrode, and thus are used for etching. Electrons produced by ionizing the active gas through the plasma treatment exhibit various behaviors. The electrons flow toward the temperature control target W, or flow to the ground potential through the upper electrode 203. Most of the electrons are stored in the blocking capacitor 205 through the lower electrode 202.

Figure 6:
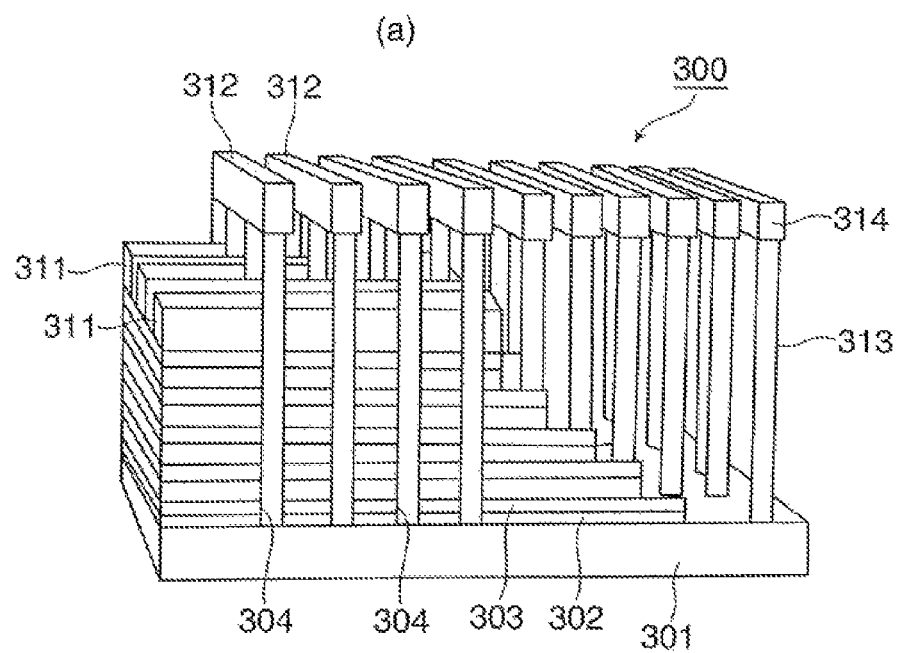
FIG. 6 are schematic configuration views for illustrating a three-dimensional NAND flash memory.
Figure 6:
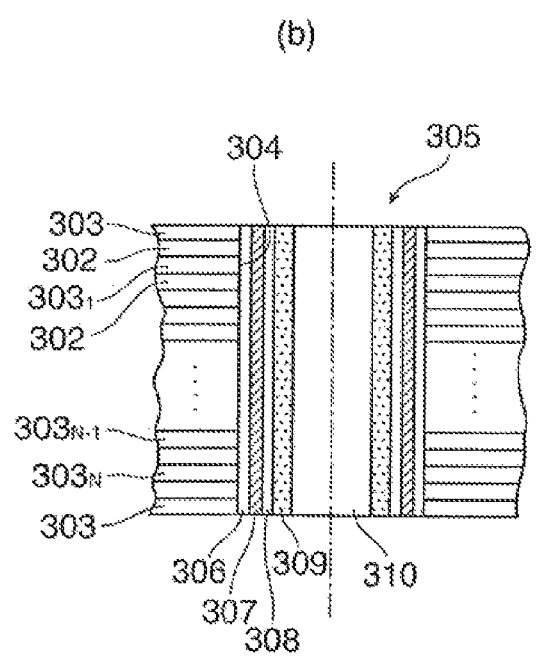

As the temperature control target W to be controlled in temperature by the chiller device 100, a semiconductor element, a flat panel display (FPD), or a solar cell is given. In the embodiment of the present invention, as the temperature control target W, a semiconductor wafer to be used for a three-dimensional NAND flash memory is given. As illustrated in FIG. 6, a three-dimensional NAND flash memory 300 includes a Si substrate 301, and a plurality of $SiO_2$ layers 302 and a plurality of poly-Si layers 303 alternately laminated on the Si substrate 301. The number of laminated layers of the $SiO_2$ layers 302 and the poly-Si layers 303 is set to, for example, twenty-four. As a matter of course, the number of laminated layers may be larger than or smaller than twenty-four. The poly-Si layers 303 each having a flat sheet shape serve as control electrodes for a NV-MOS, and the $SiO_2$ layers 302 serve as insulating layers located between the poly-Si layers 303. Holes 304 are formed through etching treatment in a laminate film, which includes the plurality of $SiO_2$ layers 302 and the plurality of poly-Si layers 303 alternately laminated, so as to penetrate the laminate film from an uppermost layer to a lowermost layer of the laminate film. An opening dimension of the hole 304 is set to, for example, about a diameter of 50 nm or set to be equal to or smaller than the diameter of 50 nm. A ratio (aspect ratio) between the opening dimension and a depth of the hole 304 is set to from about 50 to about 100, or set to a value equal to or larger than 100. As illustrated in FIG. 6 (b), an SONGS structure 305 is formed in the hole 304. The SONGS structure 305 includes a $SiO_2$ layer 306, a SiN layer 307, a $SiO_2$ layer 308, a poly-Si layer 309, and a $SiO_2$ layer 310 concentrically arranged in the stated order from an outer periphery of the SONGS structure 305. The $SiO_2$ layer 310 is located at a center of the SONGS structure 305. The SiN layer 307 forming the SONGS structure 305 serves as a layer configured to trap electric charge of the SONGS structure 305. The $SiO_2$ layer 306 is formed of a thin film having a size of 10 nm or less so as to allow an electric current to flow due to the tunnel effect, or formed of an extremely thin film so as to intensify an electric field from a control gate. The poly-Si layer 309 extending in the vertical direction in the drawing sheet serves as a channel for a MOS. Unlike a typical planar MOS, the channel is arranged in the hole 304 in the vertical direction, and thus is called "V-Channel" (vertical channel). Further, etching treatment is performed in a stepwise manner on a chip end so as to draw continuity from the control electrodes to an upper surface, thereby drawing the electrodes.

When the number of laminated layers of the $SiO_2$ layers 302 and the poly-Si layers 303 is twenty-four, etching treatment is performed to form the hole 304 so that the depth of the hole 304 is about 2,400 nm and the diameter of the hole 304 is 50 nm. As a result, the aspect ratio is 48 (=2,400/50). As described above, the etching treatment for forming the hole 304 corresponds to etching treatment performed on a substance obtained by laminating the $SiO_2$ layers 302 and the poly-Si layers 303. It is required that etching gas (charged particles of plasma) be caused to perpendicularly enter an entire surface of the semiconductor wafer W having a diameter of about 300 mm.

Figure 7:
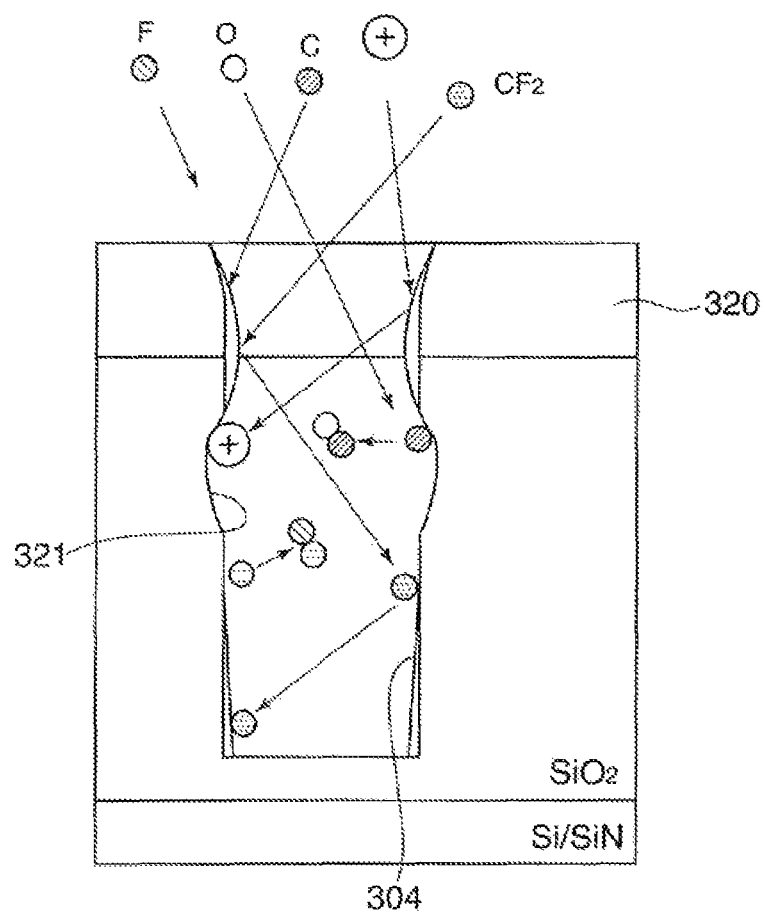
FIG. 7 is a schematic view for illustrating an etching step to be performed on a semiconductor wafer.

However, as illustrated in FIG. 7, the etching treatment for forming the hole 304 is performed after a mask (resist portion) 320 with an opening having a predetermined shape is formed on a surface of the lamination film. It is known that the following failure called "bowing" 321 may occur in such a case. Specifically, ions that perform etching are reflected on a side surface of the opening of the mask (resist portion) 320, and perform etching not on the hole 304 in the depth direction but on the side surface of the hole 304. As a result, the failure, such as increase in opening width of the hole 304 in a barrel manner, occurs.

In order to prevent and suppress such etching failure called "bowing" 321, it is effective to increase the temperature of the semiconductor wafer W in accordance with progress of the etching treatment, to thereby reduce a deposit ratio of carbon (C) on the side surface of the opening of the mask (resist portion) 320. Therefore, in the plasma treatment apparatus 200, it is important to control the temperature of the semiconductor wafer W.

In FIG. 6, reference symbols 311, 312, 313, and 314 denote a string selection line, a bit line, a contact line, and an interconnect line, respectively.

Thus, in order to perform etching evenly on the hole 304 having a high aspect ratio and improve a yield in manufacture of the three-dimensional NAND flash memory 300, as illustrated in FIG. 3, it is required that the temperature of the temperature control target W of the plasma treatment apparatus 200 be continuously controlled to, for example, 20° C., 30° C., 40° C., and 80° C. in the plurality of steps in accordance with the progress of the etching step.

Further, it is desired that the chiller device 100 not only can control the temperature of the semiconductor wafer W in the plurality of steps with excellent accuracy, but also can satisfy a requirement that a transition time period for reaching a target temperature be matched with a step time period in each etching step. The step time period in each etching step depends on a matter of the etching step and treatment performance of the plasma treatment apparatus 200. However, it is desired that one step take from 200 seconds to 300 seconds, and it is more desired that a plurality of steps proceed with such a transition time period that the plurality of steps are performed at between 20° C. and 80° C. and one step takes about 100 seconds (0.6° C./second).

<Specific Configuration of Chiller Device>

Figure 8:
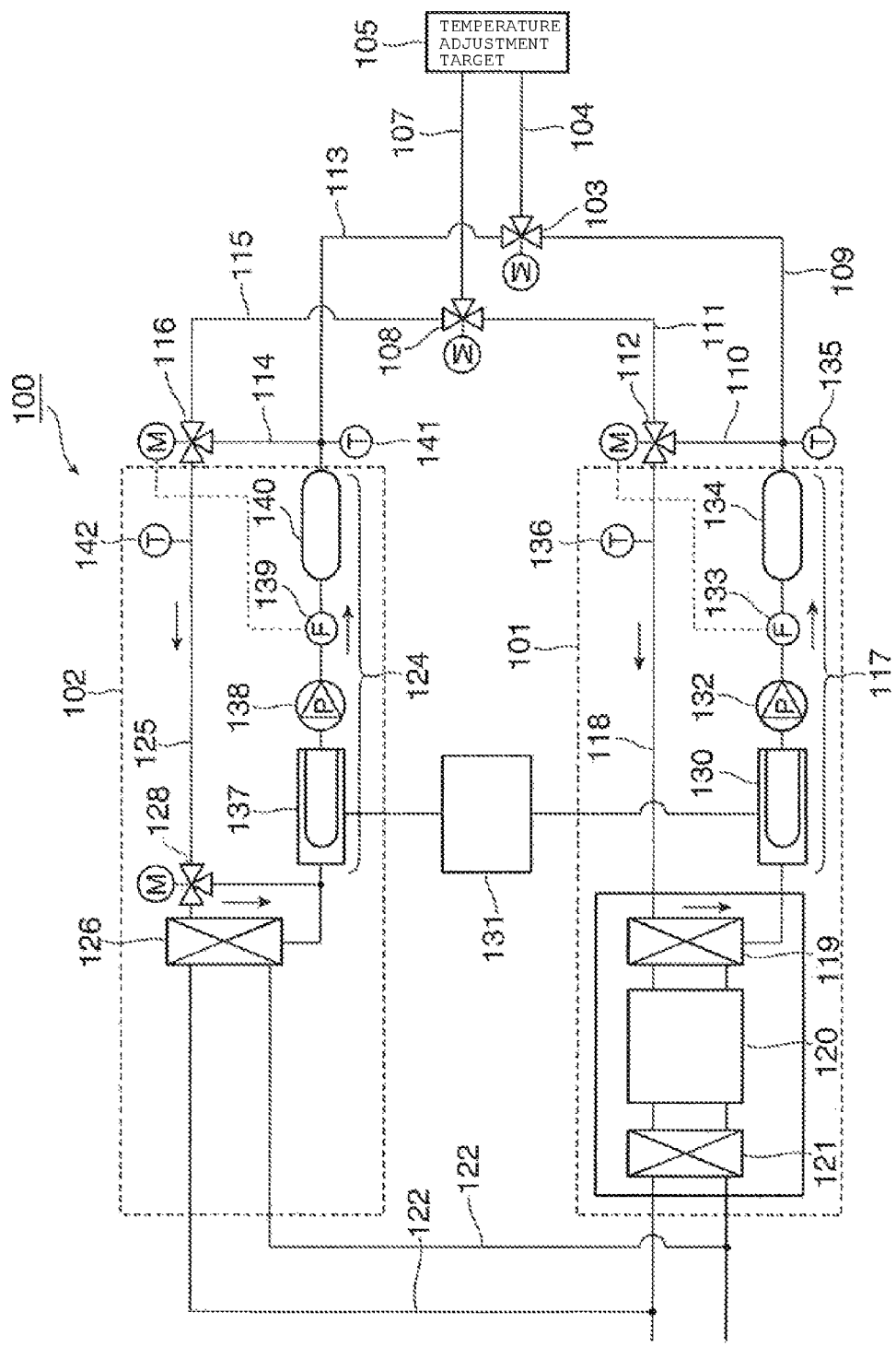
FIG. 8 is a piping configuration diagram for illustrating the constant-temperature maintaining device (chiller device) as the temperature control device according to the first embodiment of the present invention.

FIG. 8 is a circuit diagram for specifically illustrating the constant-temperature maintaining device (chiller device) according to the first embodiment of the present invention.

As described above, the chiller device 100 is used to control the temperature of the temperature control target (workpiece) W, which is held on, for example, the electrostatic chuck 129 of the plasma treatment apparatus 200 (see FIG. 2), to a desired temperature. As illustrated in FIG. 8, the chiller device 100 includes, in the cooling-side brine temperature adjustment circuit 117, a first heater 130 as first heating means for heating the brine, which flows to the secondary side of the evaporator 119 through the lower-temperature-side circulating pipe 118, to a desired temperature. In the evaporator 119 of the lower temperature fluid supply portion 101, the fluid for temperature control returned to the lower temperature fluid supply portion 101 is cooled to a temperature (for example, from about +10° C. to about +15° C.) lower than an original set temperature (for example, +20° C.) for the lower temperature fluid. As the first heater 130, for example, there is used heating means such as an electric heater for heating the fluid for temperature control, which is cooled in the evaporator 119 to the temperature lower than the original set temperature (for example, +20° C.) for the lower temperature fluid, to the original set temperature for the lower temperature fluid. The first heater 130 is connected to a common tank 131 provided to be shared between the cooling-side brine temperature adjustment circuit 117 and the heating-side brine temperature adjustment circuit 124. The brine is supplied from the common tank 131 to the first heater 130 as required.

A first pump 132 is connected to a downstream side of the first heater 130 in a flowing direction of the brine. The first pump 132 is configured to supply the lower temperature fluid to the temperature adjustment target device 105. The first pump 132 is configured to control a discharge rate of the lower temperature fluid through an inverter circuit (not shown) based on the flow rate of the lower temperature fluid detected by a first flow rate sensor 133 through a control unit (not shown). For example, the first pump 132 is controlled so as to keep the discharge rate of the lower temperature fluid constant. Further, based on the flow rate of the lower temperature fluid detected by the first flow rate sensor 133, the opening degree of the third three-way valve 112 for flow rate control is controlled by the control unit (not shown) as required.

A first storage tank 134 as one example of first storage means is connected to a downstream side of the first pump 132 in the flowing direction of the brine through intermediation of a first flow meter 133. The first storage tank 134 is configured to store a certain amount of the lower temperature fluid adjusted to a desired temperature to be supplied to the temperature adjustment target device 105. A first temperature sensor 135 is connected to a supply-side branching portion of the first bypass pipe 110 on a downstream side of the first storage tank 134. The first temperature sensor 135 is one example of first temperature detection means for detecting the temperature of the lower temperature fluid to be supplied to the first three-way valve 103 for flow rate control. Further, a second temperature sensor 136 is connected to a return-side inlet of the lower temperature fluid supply portion 101. The second temperature sensor 136 is one example of the first temperature detection means for detecting the temperature of the fluid for temperature control returned to the lower temperature fluid supply portion 101 through the third three-way valve 112 for flow rate control. Based on a detection value of the second temperature sensor 136, for example, a heating level of the lower temperature fluid by the first heater 130 is controlled by the control unit (not shown).

The chiller device 100 includes, in the heating-side brine temperature adjustment circuit 124, a second heater 137 as one example of second heating means for heating in an auxiliary manner the brine, which is cooled on the secondary side of the evaporator 126, to a desired temperature. The evaporator 126 of the higher temperature fluid supply portion 102 adjusts the temperature of the fluid for temperature control returned to the higher temperature fluid supply portion 102 by cooling the returned fluid for temperature control to a temperature (for example, about +70° C.) lower than an original set temperature (for example, +80° C.) As the second heater 137, for example, there is used heating means such as an electric heater for heating in an auxiliary manner the fluid for temperature control to a desired temperature for the higher temperature fluid. The second heater 137 is connected to the common tank 131. The brine is supplied from the common tank 131 to the second heater 137 as required.

A second pump 138 is connected to a downstream side of the second heater 137 in the flowing direction of the brine. The second pump 138 is configured to supply the higher temperature fluid to the temperature adjustment target device 105. The second pump 138 is configured to control a discharge rate of the higher temperature fluid through an inverter circuit (not shown) based on the flow rate of the higher temperature fluid detected by a second flow rate sensor 139 through a control unit (not shown). For example, the second pump 139 is controlled so as to keep the discharge rate of the higher temperature fluid constant. Further, based on the flow rate of the higher temperature fluid detected by the second flow rate sensor 139, the opening degree of the fourth three-way valve 116 for flow rate control is controlled by the control unit (not shown).

A second storage tank 140 as one example of second storage means is connected to a downstream side of the second pump 138 in the flowing direction of the brine through intermediation of a second flowmeter 139. The second storage tank 140 is configured to store a certain amount of the higher temperature fluid adjusted to a desired temperature to be supplied to the temperature adjustment target device 105. A third temperature sensor 141 is connected to a supply-side branching portion of the second bypass pipe 114 on a downstream side of the second storage tank 140 in the flowing direction of the brine. The third temperature sensor 141 is one example of third temperature detection means for detecting the temperature of the higher temperature fluid. Further, a fourth temperature sensor 142 is connected to a return-side inlet of the higher temperature fluid supply portion 102. The fourth temperature sensor 142 is one example of fourth temperature detection means for detecting the temperature of the fluid for temperature control returned through the fourth three-way valve 116 for flow rate control. Based on a detection value of the fourth temperature sensor 142, a heating level of the higher temperature fluid by the second heater 137 is controlled by the control unit (not shown).

<Configurations of First to Fifth Three-Way Valves for Flow Rate Control>

As described above, the chiller device 100 includes the first to fifth three-way valves 103, 108, 112, 116, and 128 for flow rate control. The first to fifth three-way valves 103, 108, 112, 116, and 128 for flow rate control basically have the same configuration except that a relationship between an inflow port and an outflow port is reversed depending on arrangement. Here, the three-way motor valve to be used as the first three-way valve 103 for flow rate control as mixing means is described as a representative.

Figure 9:
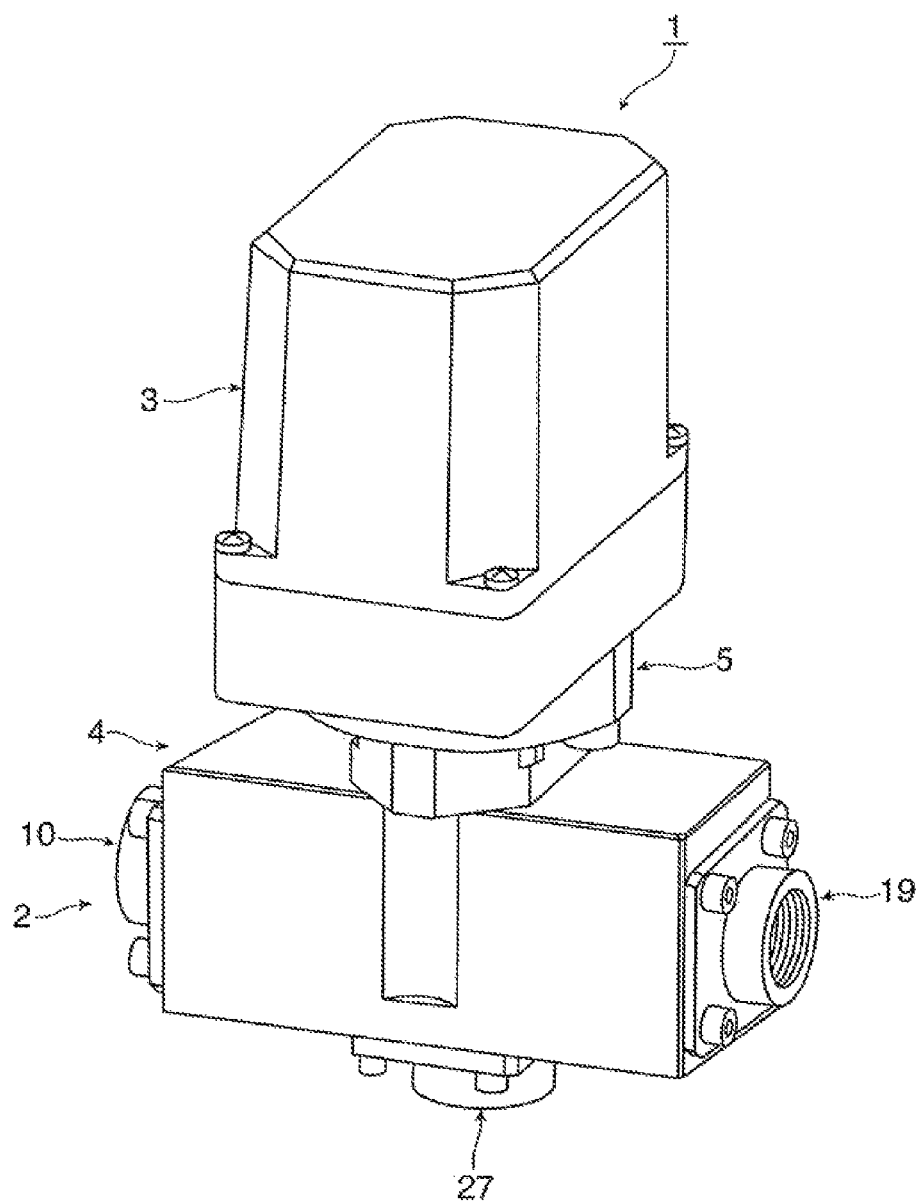
FIG. 9 is a perspective view for illustrating an outer appearance of a three-way motor valve as one example of a three-way valve for flow rate control according to the first embodiment of the present invention.
Figure 10:
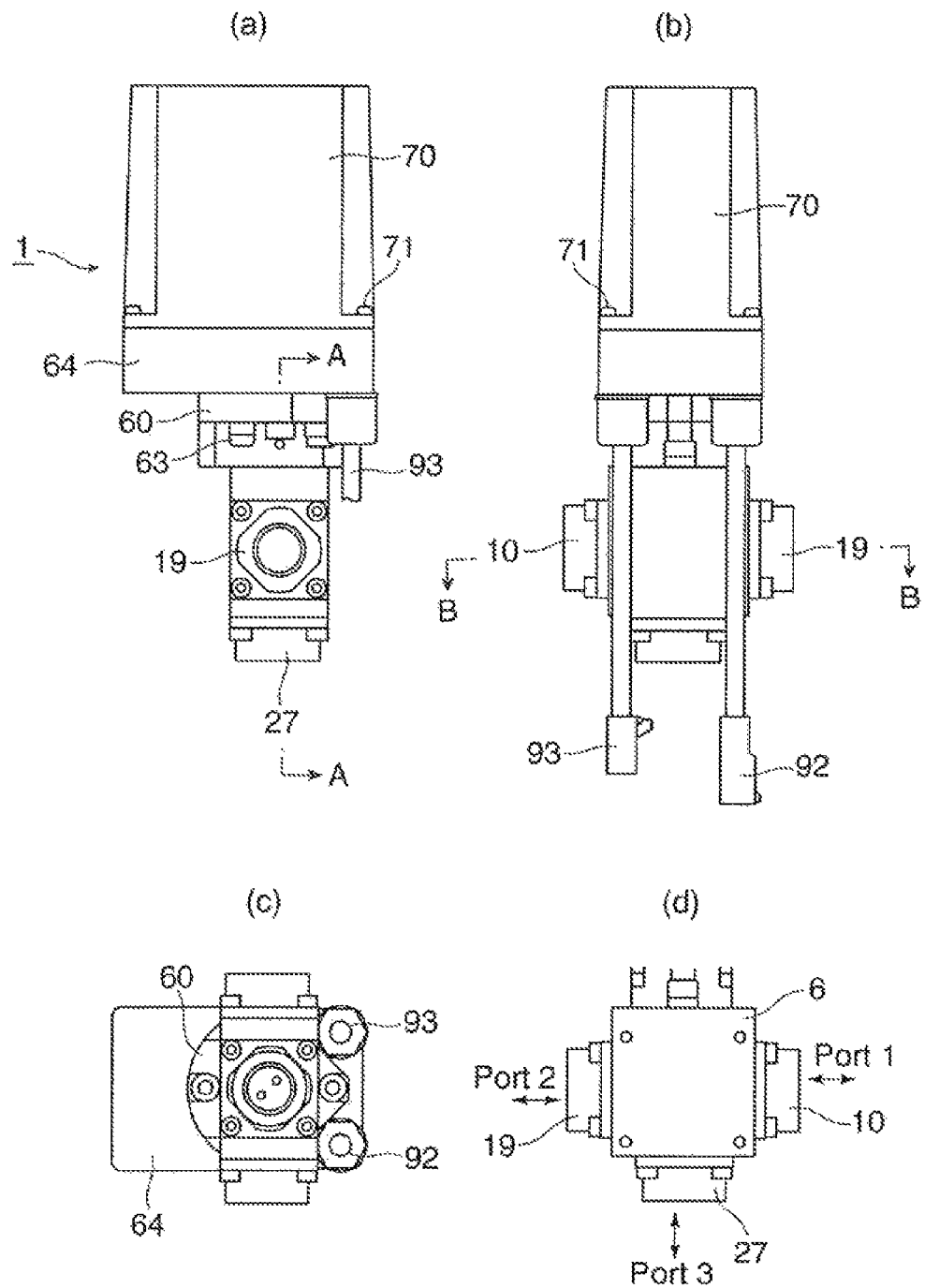
FIG. 10(*a*) to FIG. 10(*d*) are views including a front view, a right side view, a bottom view of an actuator, and a left side view of relevant parts, for illustrating the three-way motor valve as one example of the three-way valve for flow rate control according to the first embodiment of the present invention.
Figure 11:
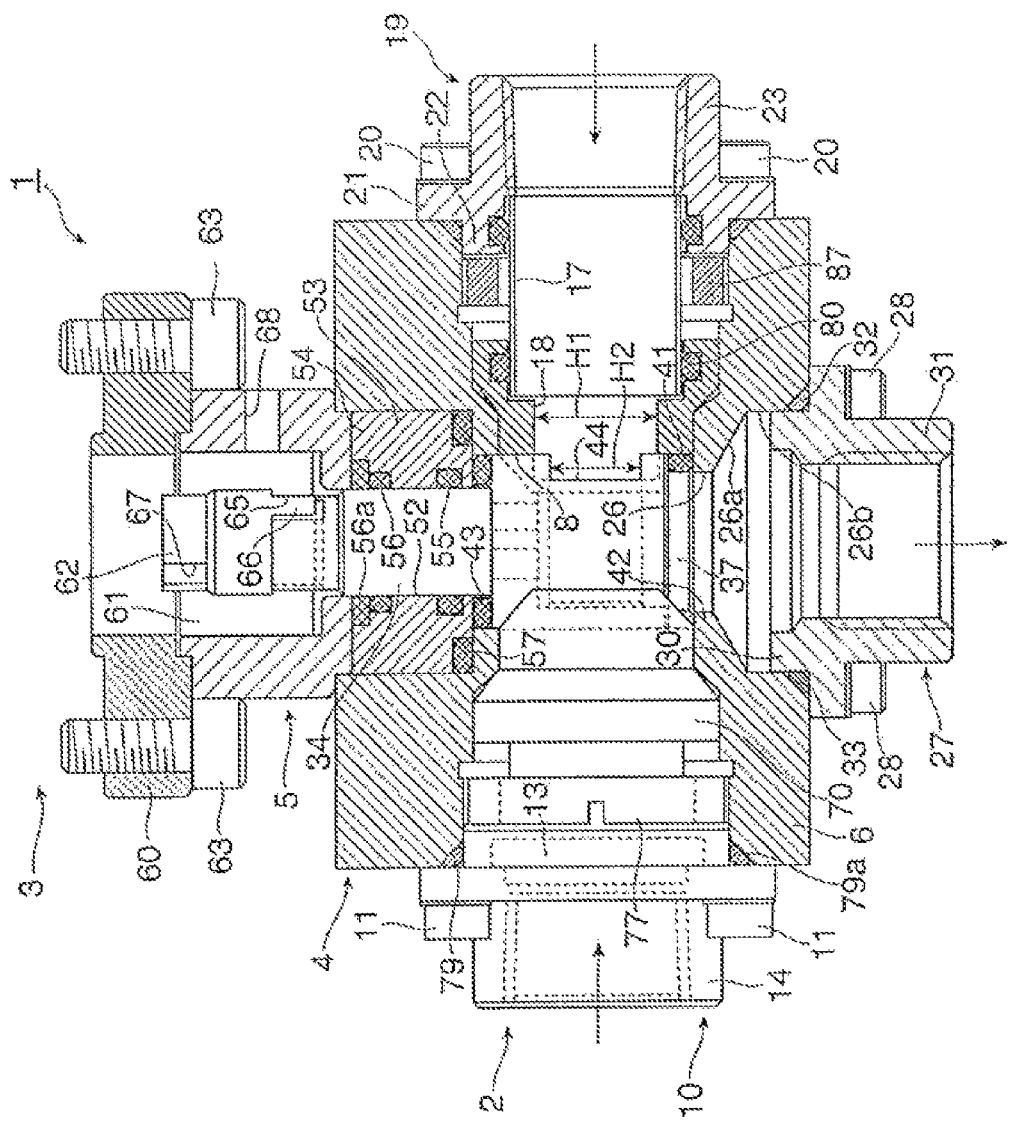
FIG. 11 is a sectional view taken along the line A-A of FIG. 10(*a*), for illustrating the three-way motor valve as one example of the three-way valve for flow rate control according to the first embodiment of the present invention.
Figure 12:
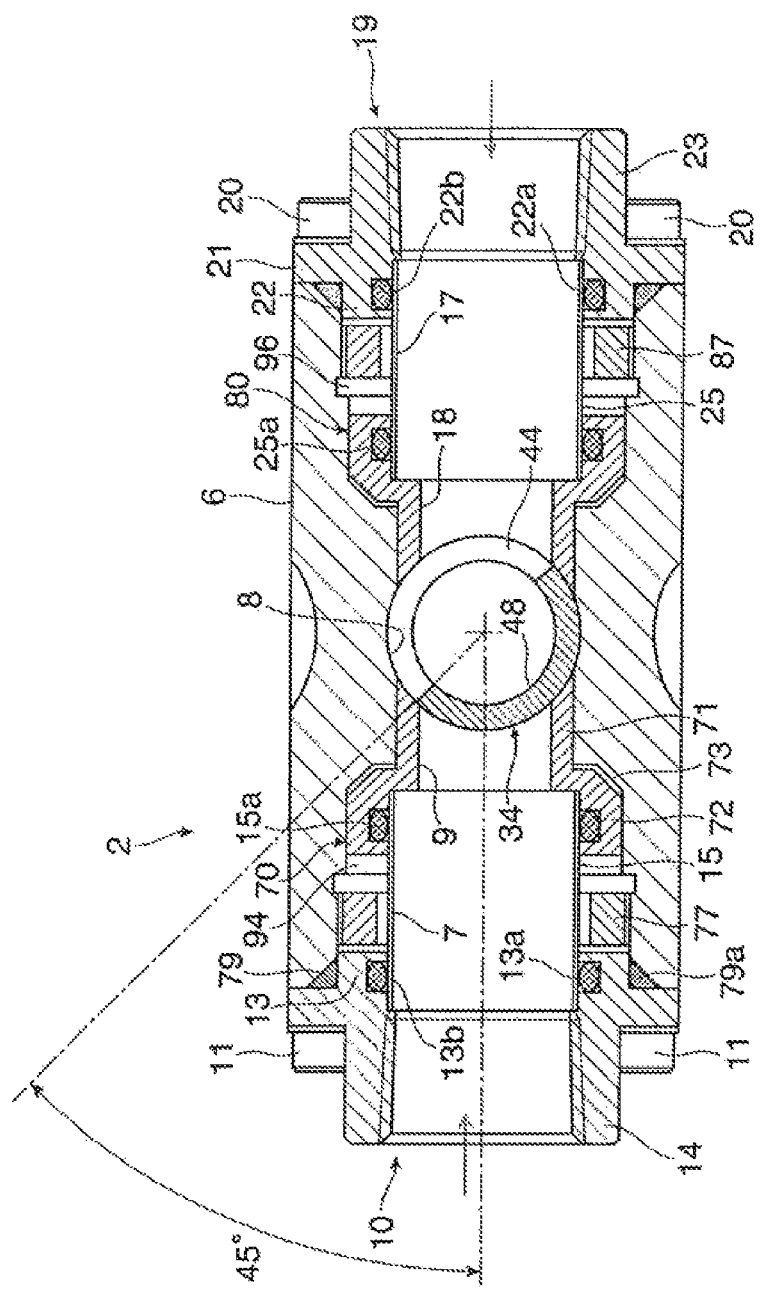
FIG. 12 is a sectional view taken along the line B-B of FIG. 10(*b*), for illustrating the three-way motor valve as one example of the three-way valve for flow rate control according to the first embodiment of the present invention.
Figure 13:
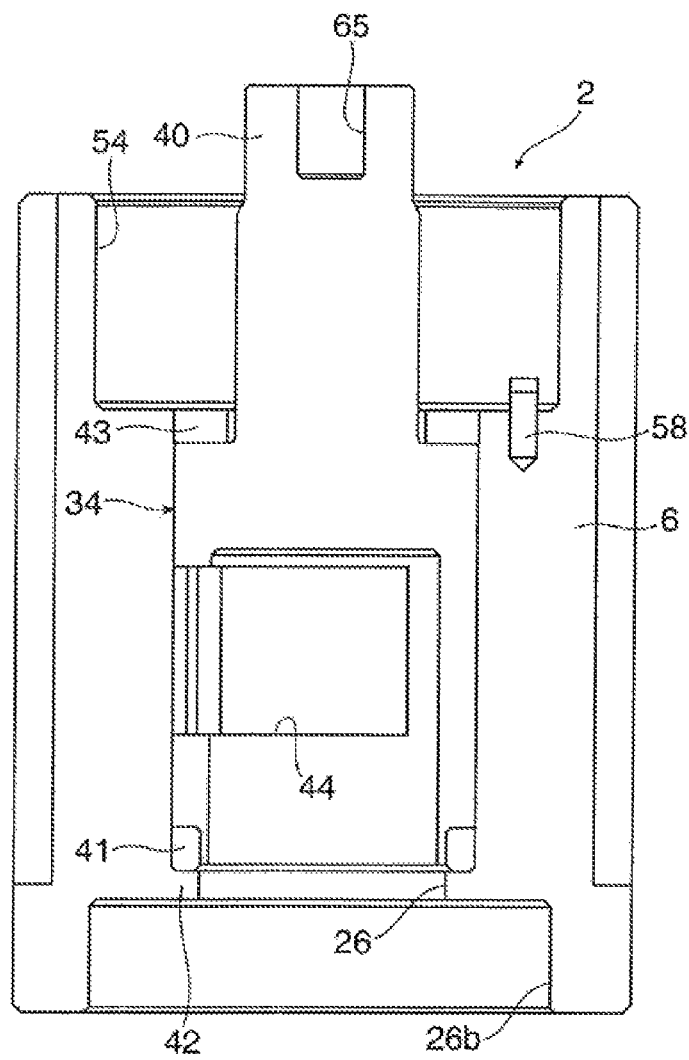
FIG. 13 is a vertical sectional view for illustrating a valve main body.
Figure 14:
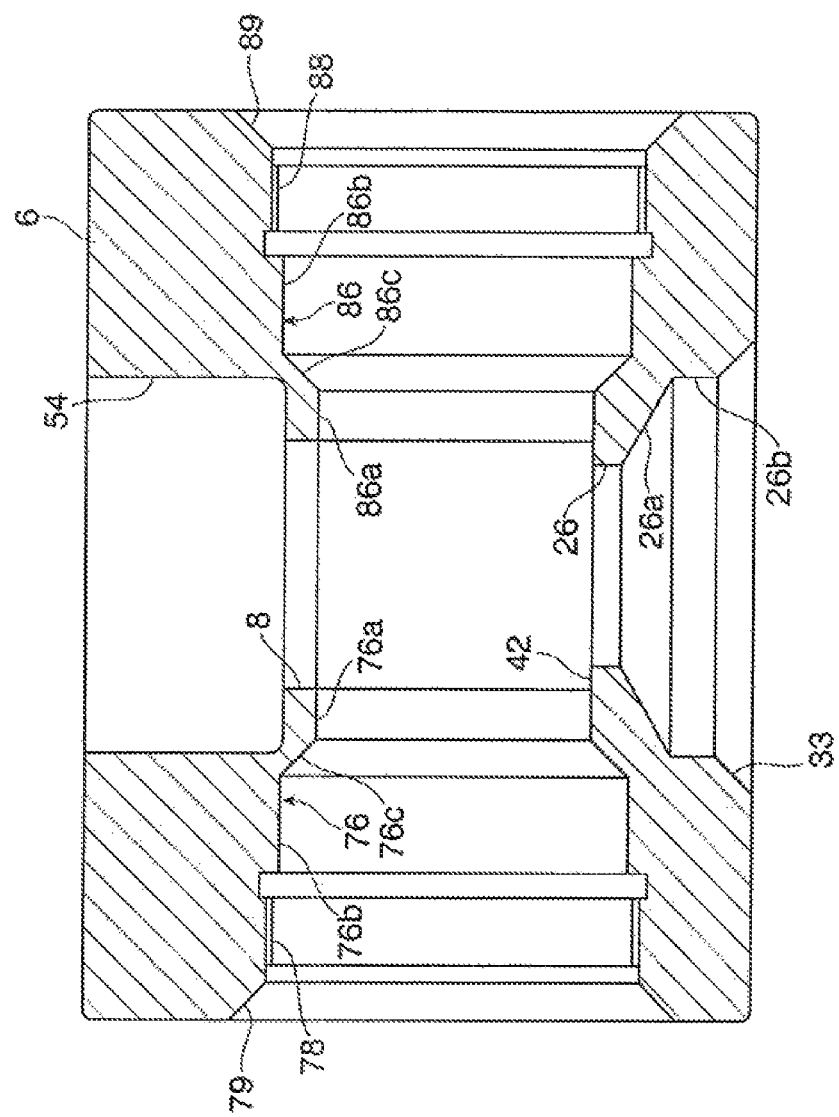
FIG. 14 is a sectional configuration view for illustrating the valve main body.
Figure 15:
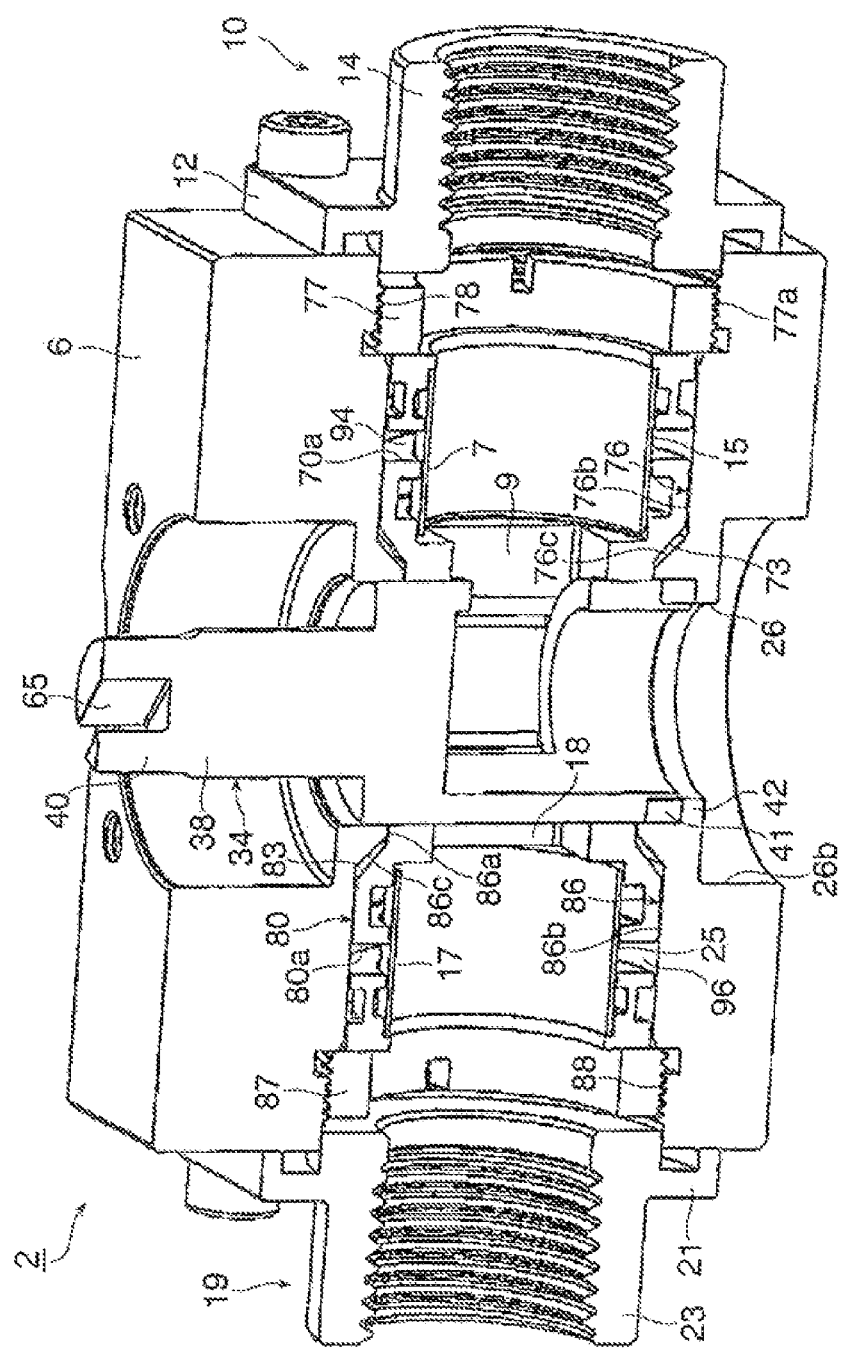
FIG. 15 is a sectional perspective view for illustrating relevant parts of the three-way motor valve as one example of the three-way valve for flow rate control according to the first embodiment of the present invention.
Figure 16:
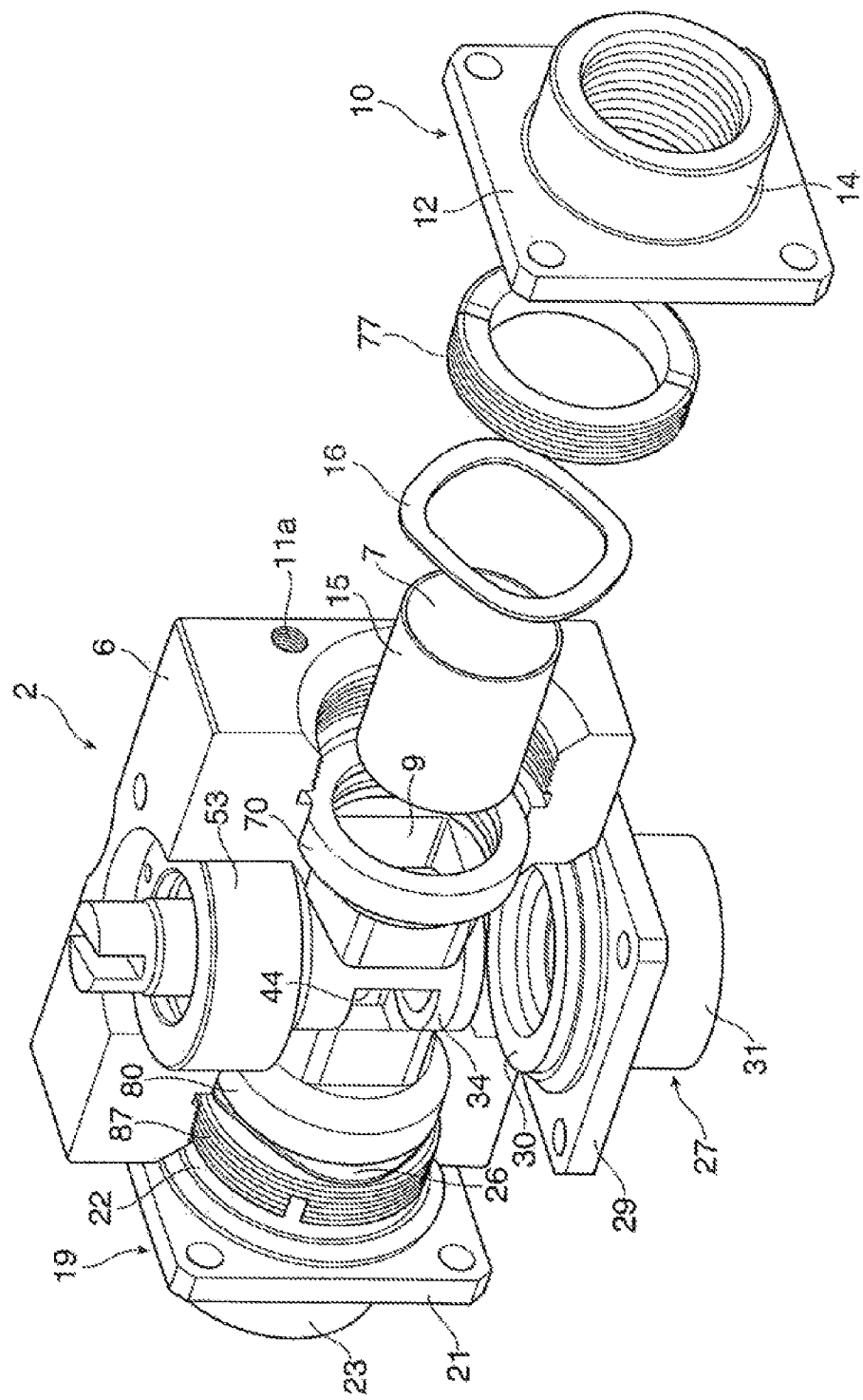
FIG. 16 is an exploded perspective view for illustrating the relevant parts of the three-way motor valve as one example of the three-way valve for flow rate control according to the first embodiment of the present invention.

FIG. 9 is a perspective view for illustrating an outer appearance of a three-way motor valve as one example of the first three-way valve for flow rate control. FIG. 10(a), FIG. 10(b), FIG. 10(c), and FIG. 10(d) are respectively a front view, a right side view, a bottom view of an actuator, and a front view of a valve portion, for illustrating the three-way motor valve. FIG. 11 is a sectional view taken along the line A-A of FIG. 10(a). FIG. 12 is a sectional view taken along the line B-B of FIG. 10(a). FIG. 13 is a vertical sectional view for illustrating the valve portion. FIG. 14 is a sectional view for illustrating a valve main body of the three-way motor valve. FIG. 15 a sectional perspective view for illustrating relevant parts of the three-way motor valve. FIG. 16 is an exploded perspective view for illustrating the relevant parts of the three-way motor valve.

A three-way motor valve 1 is constructed as a rotary three-way valve. As illustrated in FIG. 9, the three-way motor valve 1 mainly includes a valve portion 2 arranged at a lower portion thereof, an actuator 3 arranged at an upper portion thereof, and a sealing portion 4 and a coupling portion 5, which are arranged between the valve portion 2 and the actuator 3.

As illustrated in FIG. 10 to FIG. 16, the valve portion 2 includes a valve main body 6 obtained by forming metal, for example, SUS, into a substantially rectangular parallelepiped shape. As illustrated in FIG. 11 and FIG. 12, a first inflow port 7 and a first valve port 9 are formed in one side surface (left side surface in the illustrated example) of the valve main body 6. The first inflow port 7 allows inflow of a fluid forming the lower temperature fluid. The first valve port 9 has a rectangular cross section, and communicates with a valve seat 8 having a columnar space.

In the first embodiment of the present invention, instead of directly forming the first inflow port 7 and the first valve port 9 in the valve main body 6, a first valve seat 70 as one example of a first valve port forming member having the first valve port 9, and a first flow passage forming member 15 forming the first inflow port 7 are fitted to the valve main body 6, thereby providing the first inflow port 7 and the first valve port 9.

Figure 17:
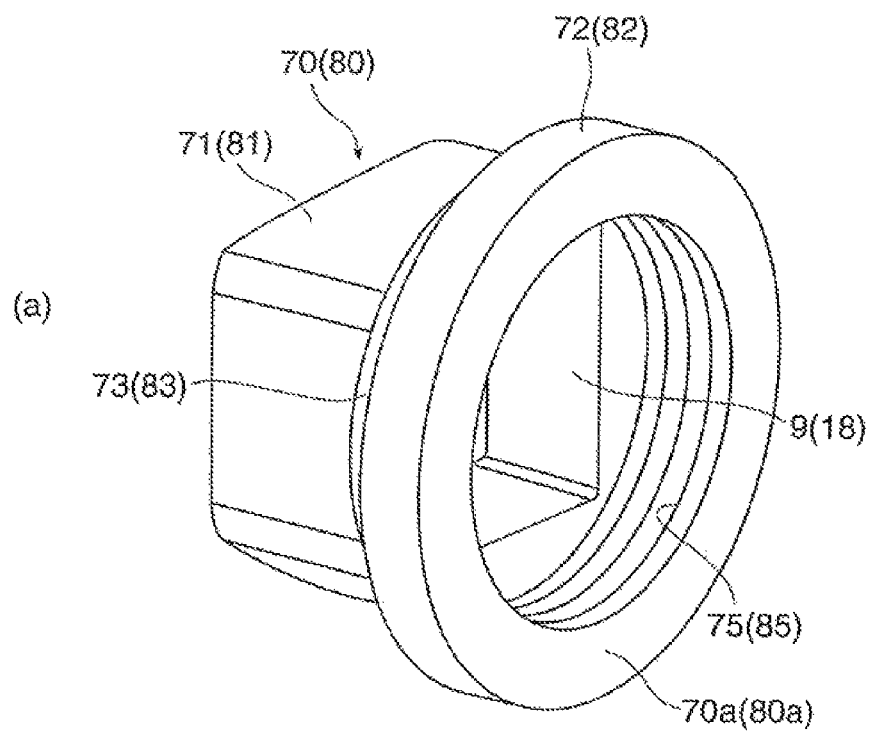
FIG. 17 are configuration views for illustrating a valve seat.
Figure 17:
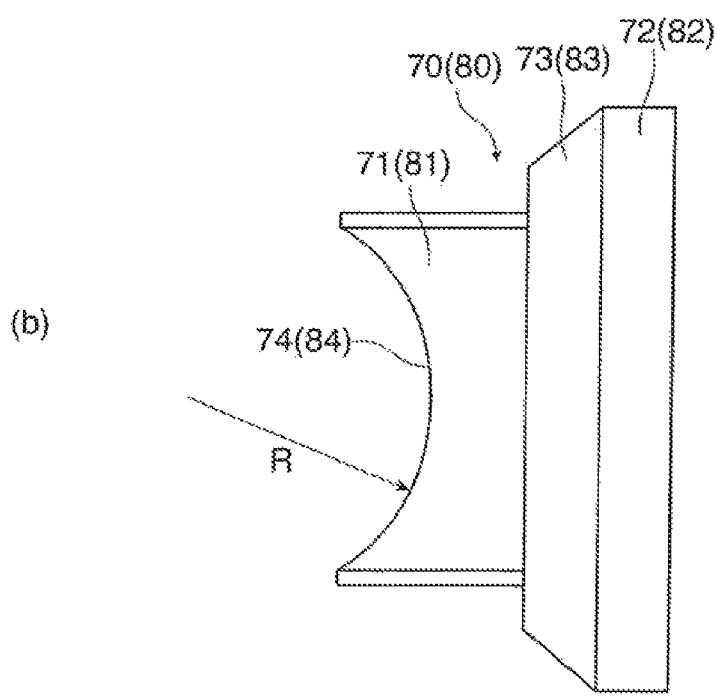

As illustrated in FIG. 17, the first valve seat 70 integrally includes a rectangular tube portion 71, a cylindrical portion 72, and a tapered portion 73. The rectangular tube portion 71 has a rectangular tube shape and is provided inside the valve main body 6. The cylindrical portion 72 has a cylindrical shape and is provided outside the valve main body 6. The tapered portion 73 has an outer diameter increasing toward the cylindrical portion 82 side and is arranged between the rectangular tube portion 71 and the cylindrical portion 72. The first valve port 9 is formed in the rectangular tube portion 71 of the first valve seat 70, and has a rectangular prism shape having a rectangular cross section (square cross section in the first embodiment of the present invention). Further, one end portion of the first flow passage forming member 15 forming the first inflow port 7 is inserted in a sealed state into the cylindrical portion 72 of the first valve seat 70. As illustrated in FIG. 12, a gap between the cylindrical portion 72 of the first valve seat 70 and the first flow passage forming member 15 is sealed by an O-ring 15a. As illustrated in FIG. 17, a recessed groove 75 configured to receive the O-ring 15a therein is formed in an inner peripheral surface of the cylindrical portion 72 of the first valve seat 70.

As a material for the first valve seat 70, for example, so-called "super engineering plastic" is used. The super engineering plastic has higher heat resistance and higher mechanical strength under a high temperature than ordinary engineering plastic. Examples of the super engineering plastic include, for example, polyether ether ketone (PEEK), polyphenylene sulfide (PPS), polyether sulfone (PES), polyamide imide (PAI), a liquid crystal polymer (LCP), polytetrafluoroethylene (PTFE), polychlorotrifluoroethylene (PCTFE), polyvinylidene fluoride (PVDF), or composite materials thereof. As the material for the first valve sheet 70, there may be used, for example, "TECAPEEK" (trademark) manufactured by Ensinger Japan Co., Ltd. serving as a PEEK resin material for cutting work, and "TECAPEEK TF 10 blue" (product name) having blending therein 10% PTFE, which is excellent in sliding property, is particularly suitably used.

As illustrated in FIG. 14 and FIG. 15, a recess 76 is formed in the valve main body 6 by, for example, machining. The recess 76 has a shape corresponding to an outer shape of the first valve seat 70 and similar to the shape of the valve seat 70. The recess 76 includes a rectangular tube portion 76a corresponding to the rectangular tube portion 71 of the first valve seat 70, a cylindrical portion 76b corresponding to the cylindrical portion 72, and a tapered portion 76c corresponding to the tapered portion 73. A length of the cylindrical portion 76b of the valve main body 6 is set larger than a length of the cylindrical portion 72 of the first valve seat 70. As described later, the cylindrical portion 76b of the valve main body 6 forms a first pressure applying portion 94. The first valve seat 70 is fitted to the recess 76 of the valve main body 6 so as to be freely movable, although by a slight distance, in a direction of moving close to and away from a valve shaft 34 serving as a valve body.

Under a state in which the first valve seat 70 is fitted to the recess 76 of the valve main body 6, a slight gap is defined between an outer peripheral surface of the first valve seat 70 and the inner peripheral surface of the recess 76 of the valve main body 6. A fluid having flowed into the valve seat 8 may leak and flow into a region around an outer periphery of the first valve seat 70 through the slight gap. Further, the fluid having leaked into the region around the outer periphery of the first valve seat 70 is led into the first pressure applying portion 94 being a space defined on an outer side of the cylindrical portion 72 of the first valve seat 70. The first pressure applying portion 94 is configured to apply a pressure of the fluid to a surface 70a of the first valve seat 70 opposite to the valve shaft 34. As described later, the fluid flowing into the valve seat 8 is a fluid flowing in through a second valve port 18 as well as a fluid flowing in through the first valve port 9. The first pressure applying portion 94 is partitioned under a state in which the first flow passage forming member 15 seals the first pressure applying portion 94 with respect to the first inflow port 7.

The pressure of the fluid, which is to be applied to the valve shaft 34 arranged inside the valve seat 8, depends on a flow rate of the fluid determined by an opening/closing degree of the valve shaft 34. The fluid flowing into the valve seat 8 also flows (leaks) through the first valve port 9 and the second valve port 18 into a slight gap defined between the valve seat 8 and an outer peripheral surface of the valve shaft 34. Therefore, into the first pressure applying portion 94 adapted for the first valve seat 70, not only the fluid flowing in through the first valve port 9 flows (leaks), but also the fluid flowing into the slight gap defined between the valve seat 8 and the outer peripheral surface of the valve shaft 34 and flowing in through the second valve port 18 flows (leaks).

Further, as illustrated in FIG. 11, FIG. 12 and FIG. 15, a slight gap is defined between the tapered portion 73 of the first valve seat 70 and the tapered portion 76c of the recess 76. As a result, under a state in which the first valve seat 70 is fitted in the recess 76 of the valve main body 6, by a distance corresponding to the slight gap between the tapered portion 73 and the tapered portion 76c of the recess 76, the valve seat 70 is freely movable (displaced) by a length of from about several hundred micrometers to about several millimeters along inward and outward directions of the valve main body 6, and the fitting position of the valve seat 70 is adjustable.

Figure 18:
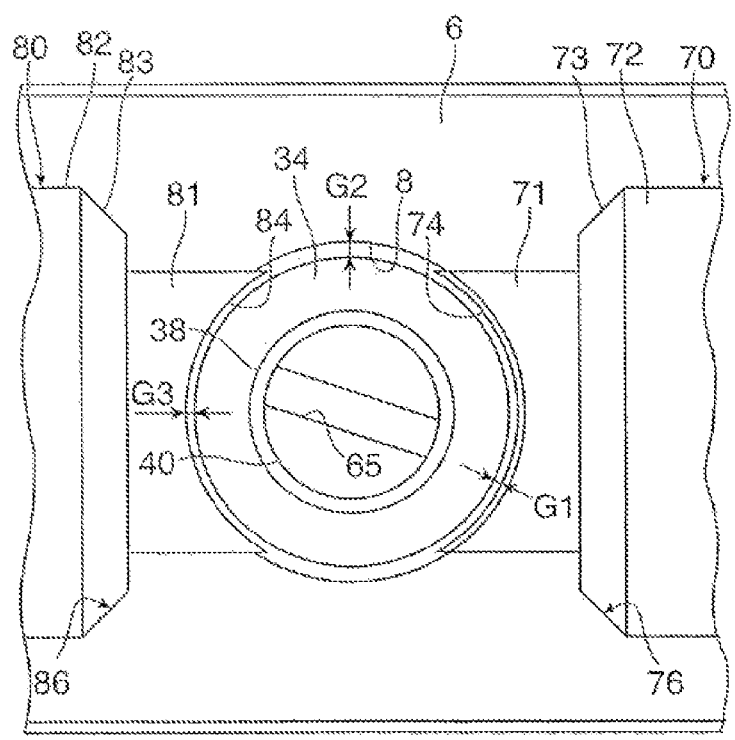
FIG. 18 is a configuration view for illustrating a relationship between the valve seat and a valve shaft.

As illustrated in FIG. 17(b), a concave portion 74 is formed at a distal end of the rectangular tube portion 71 of the first valve seat 70. The concave portion 74 is one example of a gap reducing portion having an arc shape in plan view, which forms part of a curved surface of a columnar shape corresponding to the valve seat 8 having a columnar shape in the valve main body 6. A curvature radius R of the concave portion 74 is set to a value substantially equal to a curvature radius of the valve seat 8 or a curvature radius of the valve shaft 34. In order to prevent biting of the valve shaft 34 to be rotated inside the valve seat 8, as described later, the valve seat 8 of the valve main body 6 defines a slight gap with respect to the outer peripheral surface of the valve shaft 34. As illustrated in FIG. 18, the concave portion 74 of the first valve seat 70 is fitted so as to protrude toward the valve shaft 34 side more than the valve seat 8 of the valve main body 6 or so as to be brought into contact with the outer peripheral surface of the valve shaft 34 under a state in which the first valve seat 70 is fitted to the valve main body 6. As a result, a gap G between the valve shaft 34 and an inner surface of the valve seat 8 of the valve main body 6 being a member opposed to the valve shaft 34 is partially set to a value reduced by the protruding amount of the concave portion 74 of the first valve seat 70 as compared to that of a gap between the valve shaft 34 and another portion of the valve seat 8. Thus, a gap G1 between the concave portion 74 of the first valve seat 70 and the valve shaft 34 is set to a desired value (G1<G2) smaller than (or a gap narrower than) a gap G2 between the valve shaft 34 and the inner surface of the valve seat 8. The gap G1 between the concave portion 74 of the first valve seat 70 and the valve shaft 34 may correspond to a state in which the concave portion 74 of the valve seat 70 is brought into contact with the valve shaft 34, that is, a state in which no gap is defined (the gap G1=0).

However, in a case in which the concave portion 74 of the first valve seat 70 is brought into contact with the valve shaft 34, there is a fear in that driving torque of the valve shaft 34 is increased due to contact resistance of the concave portion 74 when the valve shaft 34 is driven to rotate. Accordingly, a contact degree of the concave portion 74 of the first valve seat 70 with the valve shaft 34 is adjusted in consideration of rotational torque of the valve shaft 34. That is, the contact degree is adjusted to such an extent as to involve no increase in the driving torque of the valve shaft 34 or involve slight increase even when the driving torque is increased, and cause no trouble for rotation of the valve shaft 34.

As illustrated in FIG. 16, the first flow passage forming member 15 is made of metal such as SUS, and has a cylindrical shape having a relatively small thickness. The first flow passage forming member 15 has the first inflow port 7 formed therein to communicate with the first valve port 9 irrespective of shift of a position of the first valve seat 70.

Figure 19:
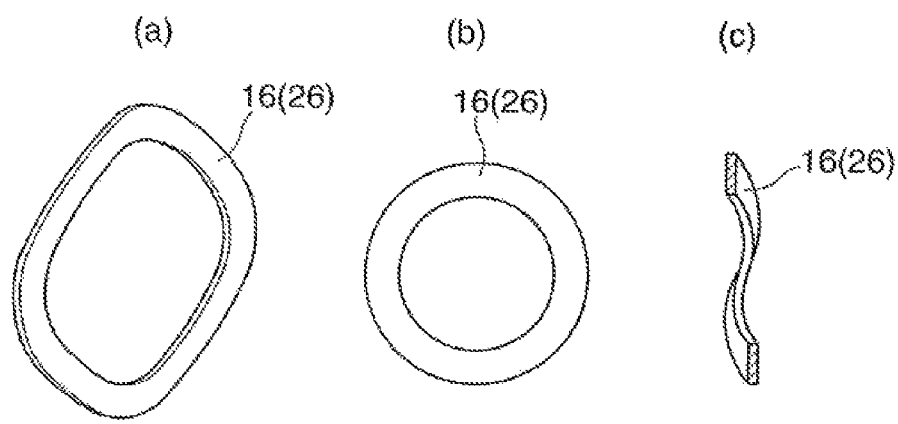
FIG. 19 are configuration views for illustrating a wave washer.

A first wave washer (corrugated washer) 16 is provided on an outer side of the cylindrical portion 72 of the first valve seat 70 along an axial direction thereof. The first wave washer 16 is one example of an elastic member configured to allow the first valve seat 70 to move in the direction of moving close to and away from the valve shaft 34 while allowing displacement of the first valve seat 70 in the direction of moving close to and away from the valve shaft 34. As illustrated in FIG. 19, the first wave washer 16 is made of, for example, stainless steel, iron, or phosphor bronze, and has an annular shape having a desired width when a front side thereof is projected. Further, a side surface of the first wave washer 16 is formed into a wavy (corrugated) shape, and the first wave washer 16 is elastically deformable in a thickness direction thereof. An elastic modulus of the first wave washer 16 is determined by, for example, the thickness, a material, or the number of waves of the first wave washer 16. The first wave washer 16 is received in the first pressure applying portion 94.

Figure 20:
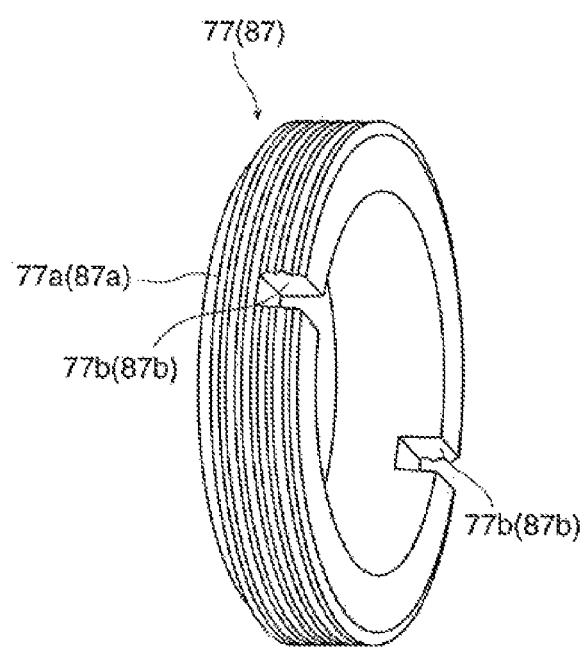
FIG. 20 is a perspective configuration view for illustrating an adjusting ring.

Moreover, a first adjusting ring 77 is arranged on an outer side of the first wave washer 16. The first adjusting ring 77 is one example of an adjusting member configured to adjust the gap G1 between the valve shaft 34 and the concave portion 74 of the first valve seat 70 via the first wave washer 16. As illustrated in FIG. 20, the first adjusting ring 77 is made of a synthetic resin having heat resistance or metal, and is formed of a cylindrical member having a relatively small length and a male thread 77a formed in an outer peripheral surface thereof. Recessed grooves 77b are formed in an outer end surface of the first adjusting ring 77 so as to be 180 degrees opposed to each other. When the first adjusting ring 77 is fastened and fitted into a female thread portion 78 formed in the valve main body 6, a jig (not shown) for adjusting a fastening amount is locked to the recessed grooves 77b so as to turn the first adjusting ring 77.

As illustrated in FIG. 14, the female thread portion 78 for fitting the first adjusting ring 77 is formed in the valve main body 6. A tapered portion 79 is formed at an opening end portion of the valve main body 6, and has a diameter increasing toward an outer periphery thereof. An O-ring 79a is interposed in the tapered portion 79.

The first adjusting ring 77 is configured to adjust an amount (distance) of pushing and moving the first valve seat 70 inward by the first adjusting ring 77 through adjustment of a fastening amount of the first adjusting ring 77 with respect to the female thread portion 78 of the valve main body 6. When the fastening amount of the first adjusting ring 70 is increased, as illustrated in FIG. 18, the first valve seat 70 is pushed by the first adjusting ring 77 via the first wave washer 16 so that the concave portion 74 protrudes from an inner peripheral surface of the valve seat 8 and is displaced in a direction of approaching the valve shaft 34. Thus, the gap G1 between the concave portion 74 and the valve shaft 34 is reduced. Further, when the fastening amount of the first adjusting ring 77 is set to a small amount in advance, the distance of pushing and moving the first valve seat 70 by the first adjusting ring 77 is reduced. As a result, the first valve seat 70 is arranged apart from the valve shaft 34, and the gap G1 between the concave portion 74 of the first valve seat 70 and the valve shaft 34 is relatively increased. The male thread 77a of the first adjusting ring 77 and the female thread portion 78 of the valve main body 6 are each set to have a small pitch. With this configuration, a protruding amount of the first valve seat 70 can be finely adjusted.

Further, as illustrated in FIG. 11 and FIG. 12, a first flange member 10 as one example of a connecting member, which is configured to connect a pipe, or the like (not shown), for allowing inflow of the fluid, is mounted to one side surface of the valve main body 6 with four hexagon socket head cap screws 11. In FIG. 16, a reference symbol 11a denotes a screw hole in which the hexagon socket head cap screw 11 is fastened. Similarly to the valve main body 6, the first flange member 10 is made of metal, for example, SUS. The first flange member 10 includes a flange portion 12, an insertion portion 13, and a pipe connecting portion 14. The flange portion 12 has a side surface having substantially the same rectangular shape as the side surface of the valve main body 6. The insertion portion 13 has a cylindrical shape and protrudes from an inner surface of the flange portion 12 (see FIG. 11). The pipe connecting portion 14 has a substantially cylindrical shape having a large thickness and protrudes from an outer surface of the flange portion 12. A pipe (not shown) is connected to the pipe connecting portion 14. As illustrated in FIG. 12, a space between the insertion portion 13 of the first flange member 10 and the first flow passage forming member 15 is sealed by an O-ring 13a. A recessed groove 13b configured to receive the O-ring 13a is formed in an inner peripheral surface of the insertion portion 13 of the first flange member 10. An inner periphery of the pipe connecting portion 14 is set to, for example, Rc ½ being a standard for a tapered female thread having a bore diameter of about 21 mm, or a female thread having a diameter of about 0.58 inches. The shape of the pipe connecting portion 14 is not limited to the tapered female thread or the female thread. The pipe connecting portion 14 may have, for example, a tube fitting shape that allows a tube to be fitted thereto. The pipe connecting portion 14 may have any shape as long as the pipe connecting portion 14 enables inflow of a fluid through the first inflow port 7.

As illustrated in FIG. 11 and FIG. 12, second inflow port 17 and a second valve port 18 are formed in another side surface (right side surface in FIG. 11 and FIG. 12) of the valve main body 6. The second inflow port 17 allows inflow of a fluid. The second valve port 18 has a rectangular cross section, and communicates with the valve seat 8 having the columnar space.

In the first embodiment of the present invention, instead of directly forming the second inflow port 17 and the second valve port 18 in the valve main body 6, the second inflow port 17 and the second valve port 18 are formed in a second valve seat 80 that forms the second valve port 18 as one example of the valve port forming member and a second flow passage forming member 25 that forms the second inflow port 17 are fitted to the valve main body 6, thereby providing the second inflow port 17 and the second valve port 18.

The second valve seat 80 has a configuration similar to the configuration of the first valve seat 70 as illustrated in FIG. 17 with the reference symbol of the second valve seat 80 put in parentheses. That is, the second valve seat 80 integrally includes a rectangular tube portion 81, a cylindrical portion 82, and a tapered portion 83. The rectangular tube portion 81 has a rectangular tube shape and is provided inside the valve main body 6. The cylindrical portion 82 has a cylindrical shape and is provided outside the valve main body 6. The tapered portion 83 has an outer diameter increasing toward the cylindrical portion 82 side and is arranged between the rectangular tube portion 81 and the cylindrical portion 82. The second valve port 18 is formed in the rectangular tube portion 81 of the second valve seat 80, and has a rectangular prism shape having a rectangular cross section (square cross section in the first embodiment of the present invention). Further, one end portion of the second flow passage forming member 25 forming the second inflow port 17 is arranged so as to be inserted in a sealed state into the cylindrical portion 82 of the second valve seat 80. As illustrated in FIG. 12, a space between the cylindrical portion 82 of the second valve seat 80 and the second flow passage forming member 25 is sealed by an O-ring 25a. As illustrated in FIG. 17, a recessed groove 85 configured to receive the O-ring 25a is formed in an inner peripheral surface of the cylindrical portion 82 of the second valve seat 80.

As illustrated in FIG. 14 and FIG. 15, a recess 86 is formed in the valve main body 6 by, for example, machining. The recess 86 has a shape corresponding to an outer shape of the second valve seat 80 and similar to the shape of the valve seat 80. The recess 86 includes a rectangular tube portion 86a corresponding to the rectangular tube portion 81 of the second valve seat 80, a cylindrical portion 86b corresponding to the cylindrical portion 82, and a tapered portion 86c corresponding to the tapered portion 83. A length of the cylindrical portion 86b of the valve main body 6 is set larger than a length of the cylindrical portion 82 of the second valve seat 80. As described later, the cylindrical portion 86b of the valve main body 6 forms a second pressure applying portion 96. The second valve seat 80 is fitted to the recess 86 of the valve main body 6 so as to be freely movable, although by a slight distance, in a direction of moving close to and away from a valve shaft 34 serving as a valve body.

Under a state in which the second valve seat 80 is fitted to the recess 86 of the valve main body 6, a slight gap is defined between the rectangular tube portion 81 of the valve seat 80 and the rectangular tube portion 86a of the valve main body 6. A fluid having flowed into the valve seat 8 can flow into a region around an outer periphery of the second valve seat 80 through the slight gap. Further, the fluid having flowed into the region around the outer periphery of the second valve seat 80 is led into the second pressure applying portion 96 being a space defined on an outer side of the cylindrical portion 82 of the second valve seat 80. The second pressure applying portion 96 is configured to apply a pressure of the fluid to a surface 80a of the second valve seat 80 opposite to the valve shaft 34. The fluid flowing into the valve seat 8 is a fluid flowing out through the first valve port 9 as well as a fluid flowing out through the second valve port 18. The second pressure applying portion 98 is partitioned under a state in which the second flow passage forming member 25 seals the second pressure applying portion 98 with respect to the second inflow port 17.

The pressure of the fluid, which is to be applied to the valve shaft 34 arranged inside the valve seat 8, depends on a flow rate of the fluid determined by an opening/closing degree of the valve shaft 34. The fluid flowing into the valve seat 8 also flows (leaks) through the first valve port 9 and the second valve port 18 into a slight gap defined between the valve seat 8 and an outer peripheral surface of the valve shaft 34. Therefore, into the second pressure applying portion 96 adapted for the second valve seat 80, not only the fluid flowing in through the second valve port 18 flows (leaks), but also the fluid flowing into the slight gap defined between the valve seat 8 and the outer peripheral surface of the valve shaft 34 and flowing in through the first valve port 9 flows (leaks).

Further, as illustrated in FIG. 11 and FIG. 12, a slight gap is defined between the tapered portion 83 of the second valve seat 80 and the tapered portion 86c of the recess 86. As a result, under a state in which the second valve seat 80 is fitted in the recess 86 of the valve main body 6, by a distance corresponding to the slight gap between the tapered portion 83 and the tapered portion 86c of the recess 86, the valve seat 80 is freely movable by a length of from about several hundred micrometers to about several millimeters along inward and outward directions of the valve main body 6, and the fitting position of the valve seat 80 is adjustable. The second valve seat 80 is made of the same material as that for the first valve seat 70.

As illustrated in FIG. 17(b), a concave portion 84 is formed at a distal end of the rectangular tube portion 81 of the second valve seat 80. The concave portion 84 is one example of a gap reducing portion having an arc shape in plan view, which forms part of a curved surface of a columnar shape corresponding to the valve seat 8 having a columnar shape in the valve main body 6. A curvature radius R of the concave portion 84 is set to a value substantially equal to a curvature radius of the valve seat 8 or a curvature radius of a valve shaft 34. In order to prevent biting of the valve shaft 34 to be rotated inside the valve seat 8, as described later, the valve seat 8 of the valve main body 6 defines a slight gap with respect to an outer peripheral surface of the valve shaft 34. The concave portion 84 of the second valve seat 80 is fitted so as to protrude toward the valve shaft 34 side more than the valve seat 8 of the valve main body 6 or so as to be brought into contact with the outer peripheral surface of the valve shaft 34 under a state in which the second valve seat 70 is fitted to the valve main body 6. As a result, a gap G between the valve shaft 34 and an inner surface of the valve seat 8 of the valve main body 6 being a member opposed to the valve shaft 34 is partially set to a value reduced by the protruding amount of the concave portion 84 of the second valve seat 80 as compared to that of a gap between the valve shaft 34 and another portion of the valve seat 8. Thus, a gap G3 between the concave portion 84 of the second valve seat 80 and the valve shaft 34 is set to a desired value (G3<G2) smaller than (or a gap narrower than) the gap G2 between the valve shaft 34 and the inner surface of the valve seat 8. Further, the gap G3 between the concave portion 84 of the second valve seat 80 and the valve shaft 34 may correspond to a state in which the concave portion 84 of the valve seat 80 is brought into contact with the valve shaft 34, that is, a state in which no gap is defined (the gap G3=0).

However, in a case in which the concave portion 84 of the second valve seat 80 is brought into contact with the valve shaft 34, there is a fear in that driving torque of the valve shaft 34 is increased due to contact resistance of the concave portion 84 when the valve shaft 34 is driven to rotate. Accordingly, a contact degree of the concave portion 84 of the second valve seat 70 with the valve shaft 34 is adjusted in consideration of the rotational torque of the valve shaft 34. That is, the contact degree is adjusted to such an extent as to involve no increase in the driving torque of the valve shaft 34 or involve slight increase even when the driving torque is increased, and cause no trouble for rotation of the valve shaft 34.

A second wave washer (corrugated washer) 26 is provided on an outer side of the cylindrical portion 82 of the second valve seat 80. The second wave washer 26 is one example of an elastic member configured to push and move the second valve seat 80 in a direction of coming into contact with the valve shaft 34 while allowing displacement of the second valve seat 80 in a direction of moving close to and away from the valve shaft 34. As illustrated in FIG. 19, the second wave washer 26 is made of, for example, stainless steel, iron, or phosphor bronze, and has an annular shape having a desired width when a front side thereof is projected. Further, a side surface of the second wave washer 26 is formed into a wavy (corrugated) shape, and the second wave washer 26 is elastically deformable in a thickness direction thereof. An elastic modulus of the second wave washer 26 is determined by, for example, the thickness, a material, or the number of waves of the second wave washer 26. The second wave washer 26 equivalent to the first wave washer 16 is used.

Moreover, a second adjusting ring 87 is arranged on an outer side of the second wave washer 26. The second adjusting ring 87 is one example of an adjusting member configured to adjust the gap G3 between the valve shaft 34 and the concave portion 84 of the second valve seat 80 via the second wave washer 26. As illustrated in FIG. 20, the second adjusting ring 87 is made of a synthetic resin having heat resistance or metal, and is formed of a cylindrical member having a relatively small length and a male thread 87a formed in an outer peripheral surface thereof. Recessed grooves 87b are formed in an outer end surface of the second adjusting ring 87 so as to be 180 degrees opposed to each other. When the second adjusting ring 87 is fastened and fitted into a female thread portion 88 formed in the valve main body 6, a jig (not shown) for adjusting a fastening amount is locked to the recessed grooves 87b so as to turn the second adjusting ring 87.

As illustrated in FIG. 14 and FIG. 15, a second female thread portion 88 for fitting the second adjusting ring 87 is formed in the valve main body 6. A tapered portion 89 is formed at an opening end portion of the valve main body 6 and has a diameter increasing toward an outer periphery thereof. An O-ring 89a is interposed in the tapered portion 89.

The second adjusting ring 87 is configured to adjust an amount (distance) of pushing and moving the second valve seat 80 inward by the second adjusting ring 877 via the second wave washer 26 through adjustment of a fastening amount of the second adjusting ring 87 with respect to the female thread portion 88 of the valve main body 6. When the fastening amount of the second adjusting ring 87 is increased, as illustrated in FIG. 18, the second valve seat 80 is pushed by the second adjusting ring 87 via the second wave washer 26 so that the concave portion 84 protrudes from an inner peripheral surface of the valve seat 8 and is displaced in a direction of approaching the valve shaft 34. Thus, the gap G3 between the concave portion 84 and the valve shaft 34 is reduced. Further, when the fastening amount of the second adjusting ring 87 is set to a small amount in advance, the distance of pushing and moving the second valve seat 80 by the second adjusting ring 87 is reduced. As a result, the second valve seat 80 is arranged apart from the valve shaft 34, and the gap G3 between the concave portion 84 of the second valve seat 80 and the valve shaft 34 is relatively increased. The male thread 87a of the second adjusting ring 87 and the female thread portion 88 of the valve main body 6 are each set to have a small pitch. With this configuration, a protruding amount of the second valve seat 80 can be finely adjusted.

As illustrated in FIG. 11 and FIG. 12, a second flange member 19 as one example of a connecting member for connecting a pipe (not shown) which allows inflow of the fluid is mounted to the another side surface of the valve main body 6 with four hexagon socket head cap screws 20. Similarly to the first flange member 10, the second flange member 19 is made of metal, for example, SUS. The second flange member 19 has a flange portion 21, an insertion portion 22, and a pipe connecting portion 23. The flange portion 21 has a side surface having the same rectangular shape as the side surface of the valve main body 6. The insertion portion 22 has a cylindrical shape and protrudes from an inner surface of the flange portion 21. The pipe connecting portion 23 has a substantially cylindrical shape having a large thickness and protrudes from an outer surface of the flange portion 21. A pipe (not shown) is connected to the pipe connecting portion 23. As illustrated in FIG. 12, a space between the insertion portion 22 of the second flange member 19 and the second flow passage forming member 25 is sealed by an O-ring 22a. A recessed groove 22b configured to receive the O-ring 22a is formed in an inner peripheral surface of the insertion portion 22 of the second flange member 19. An inner periphery of the pipe connecting portion 23 is set to, for example, Rc ½ being a standard for a tapered female thread having a bore diameter of about 21 mm, or a female thread having a diameter of about 0.58 inches. Similarly to the pipe connecting portion 14, the shape of the pipe connecting portion 23 is not limited to the tapered female thread or the female thread. The pipe connecting portion 23 may have, for example, a tube fitting shape that allows a tube to be fitted thereto. The pipe connecting portion 23 may have any shape as long as the pipe connecting portion 23 enables inflow of a fluid through the second inflow port 17.

In the embodiment illustrated in FIG. 11 and FIG. 12, description is made of the case in which the first flow passage forming member 15 is long enough to overlap the first flange member 10 and the second flow passage forming member 25 is long enough to overlap the second flange member 19, but the first flow passage forming member 15 and the second flow passage forming member 25 may each have a smaller length than that in this case. That is, as illustrated in FIG. 15, the first flow passage forming member 15 and the second flow passage forming member 25 may be set to have such a relatively small length as to reach a first sealing member 97 and a second sealing member 98 arranged on an inner side of the first adjusting ring 77 and an inner side of the second adjusting ring 87, respectively. Similarly to the first wave washer 16 and the second wave washer 26, the first adjusting ring 77 and the second adjusting ring 87 are arranged inside the first and second pressure applying portions 96, respectively. Recessed grooves 97a and 98a are formed in an inner peripheral surface and an outer peripheral surface of each of the first adjusting ring 77 and the second adjusting ring 87. Each of the recessed grooves 97a and 98a is configured to receive an O-ring (not shown) configured to seal a space between the first flow passage forming member 15 and the second flow passage forming member 25. Further, instead of sealing the first flange member 10 and the second flange member 19 by the O-ring 89a interposed in the tapered portion 89 formed in the valve main body 6, as illustrated in FIG. 15, the first flange member 10 and the second flange member 19 may be sealed by the O-rings 79a and 89a fitted in recessed grooves 12a and 21a respectively formed in an inner surface of the flange portion 12 of the first flange member 10 and an inner surface of the flange portion 21 of the second flange member 19.

As the fluid, for example, water (such as pure water) adjusted to pressure of from 0 MPa to 1 MPa and within a temperature range of from about 0° C. to about 80° C. is suitably used. Further, as the fluid, for example, within a temperature range of from about −20° C. to about +120° C., there is used a fluid such a fluorine-based inert liquid, for example, Fluorinert (trademark) and ethylene glycol, which are neither frozen at a temperature of about −20° C. nor boiled at a temperature of about +120° C.

Further, as illustrated in FIG. 11, in a lower end surface of the valve main body 6, an outflow port 26 having a circular cross section as the third valve port is opened. The outflow port 26 allows outflow of a fluid. A third flange member 27 as one example of a connecting member for connecting a pipe (not shown) which allows outflow of the fluid is mounted to the lower end surface of the valve main body 6 with four hexagon socket head cap screws 28. A cylindrical portion 26b is opened in a lower end portion of the outflow port 26 through a tapered portion 26a. The tapered portion 26a is tapered and increased in diameter so as to allow the third flange member 27 to be fitted thereto. As illustrated in FIG. 15, without forming the tapered portion 26a, only the cylindrical portion 26b may be formed at the lower end portion of the outflow port 26. Similarly to the first and second flange members 10 and 19, the third flange member 27 is made of metal, for example, SUS. The third flange member 27 has a flange portion 29, an insertion portion 30, and a pipe connecting portion 31. The flange portion 29 has a planar surface having a rectangular shape, which is smaller than the lower end surface of the valve main body 6. The insertion portion 30 has a cylindrical shape and protrudes from an upper end surface of the flange portion 9. The pipe connecting portion 31 has a substantially cylindrical shape having a large thickness and protrudes from a lower end surface of the flange portion 29. A pipe (not shown) is connected to the pipe connecting portion 31. An inner periphery of the pipe connecting portion 31 is set to, for example, Rc ½ being a standard for a tapered female thread having a bore diameter of about 21 mm and a female thread having a diameter of about 0.58 inches. An inner peripheral end on a lower end of the outflow port 26 of the valve main body 6 has a chamfer 33 to allow an O-ring 32 to be mounted between the outflow port 26 of the valve main body 6 and the flange portion 29 of the third flange member 27. The shape of the pipe connecting portion 31 is not limited to the tapered female thread or the female thread. The pipe connecting portion 31 may have, for example, a tube fitting shape that allows a tube to be fitted thereto. The pipe connecting portion 31 may have any shape as long as the pipe connecting portion 31 enables outflow of a fluid through the outflow port 26. Further, as illustrated in FIG. 15, similarly to the first flange member 10 and the second flange member 19, the sealing structure for the flange portion 29 of the third flange member 27 may be achieved through sealing by an O-ring fitted in a recessed groove (not shown) formed in an inner surface of the flange portion 29.

Figure 21:
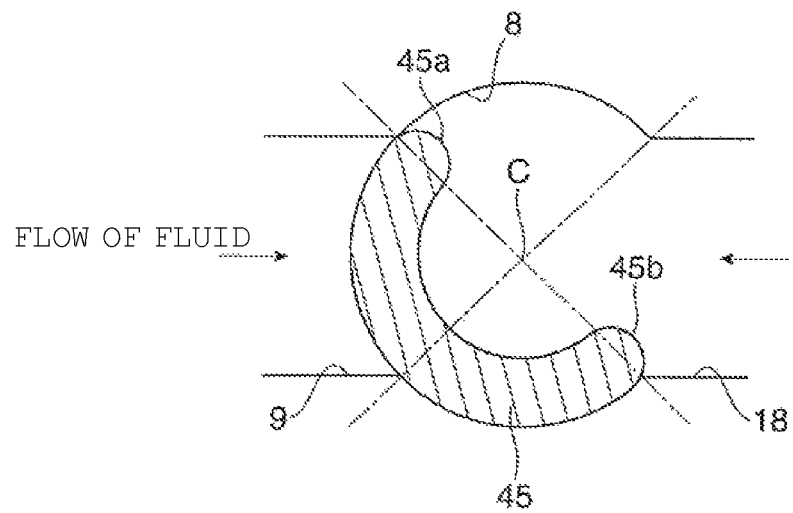
FIG. 21 are configuration views for illustrating a motion of the valve shaft.
Figure 21:
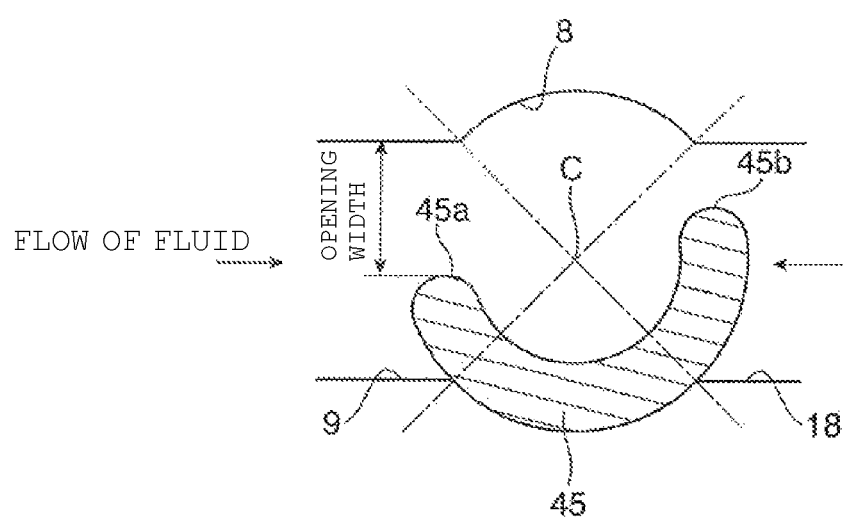

The valve seat 8 is formed in a center of the valve main body 6. The valve seat 8 forms the first valve port 9 having a rectangular cross section and the second valve port 18 having a rectangular cross section when the first valve seat 70 and the second valve seat 80 are fitted to the valve main body 6. The valve seat 8 has a space having a columnar shape corresponding to an outer shape of a valve body to be described later. Further, part of the valve seat 8 is formed by the first valve seat 70 and the second valve seat 80. The valve seat 8 having a columnar shape is provided in a state of penetrating an upper end surface of the valve main body 6. As illustrated in FIG. 21, the first valve port 9 and the second valve port 18 provided to the valve main body 6 are arranged in an axial symmetrical manner with respect to a center axis (rotation axis) C of the valve seat 8 having a columnar shape. More specifically, the first valve port 9 and the second valve port 18 are arranged so as to be orthogonal to the valve seat 8 having a columnar shape. One end edge of the first valve port 9 is opened in a position opposed to another end edge of the second valve port 18 through the center axis C, that is, in a position different by 180°. Further, another end edge of the first valve port 9 is opened in a position opposed to one end edge of the second valve port 18 through the center axis C, that is, in a position different by 180°. In FIG. 21, for convenience, illustration of a gap between the valve seat 8 and the valve shaft 34 is omitted.

Further, as illustrated in FIG. 11 and FIG. 12, the first valve port 9 and the second valve port 18 are openings each having a rectangular cross section such as a square cross section and are formed through fitting through fitting of the first valve seat 70 and the second valve seat 80 to the valve main body 6 as described above. A length of one side of the first valve port 9 and the second valve port 18 is set to be smaller than a diameter of the first inflow port 7 and the second inflow port 17. The first valve port 9 and the second valve port 18 have a cross section having a rectangular shape inscribed in the first inflow port 7 and the second inflow port 17.

Figure 22:
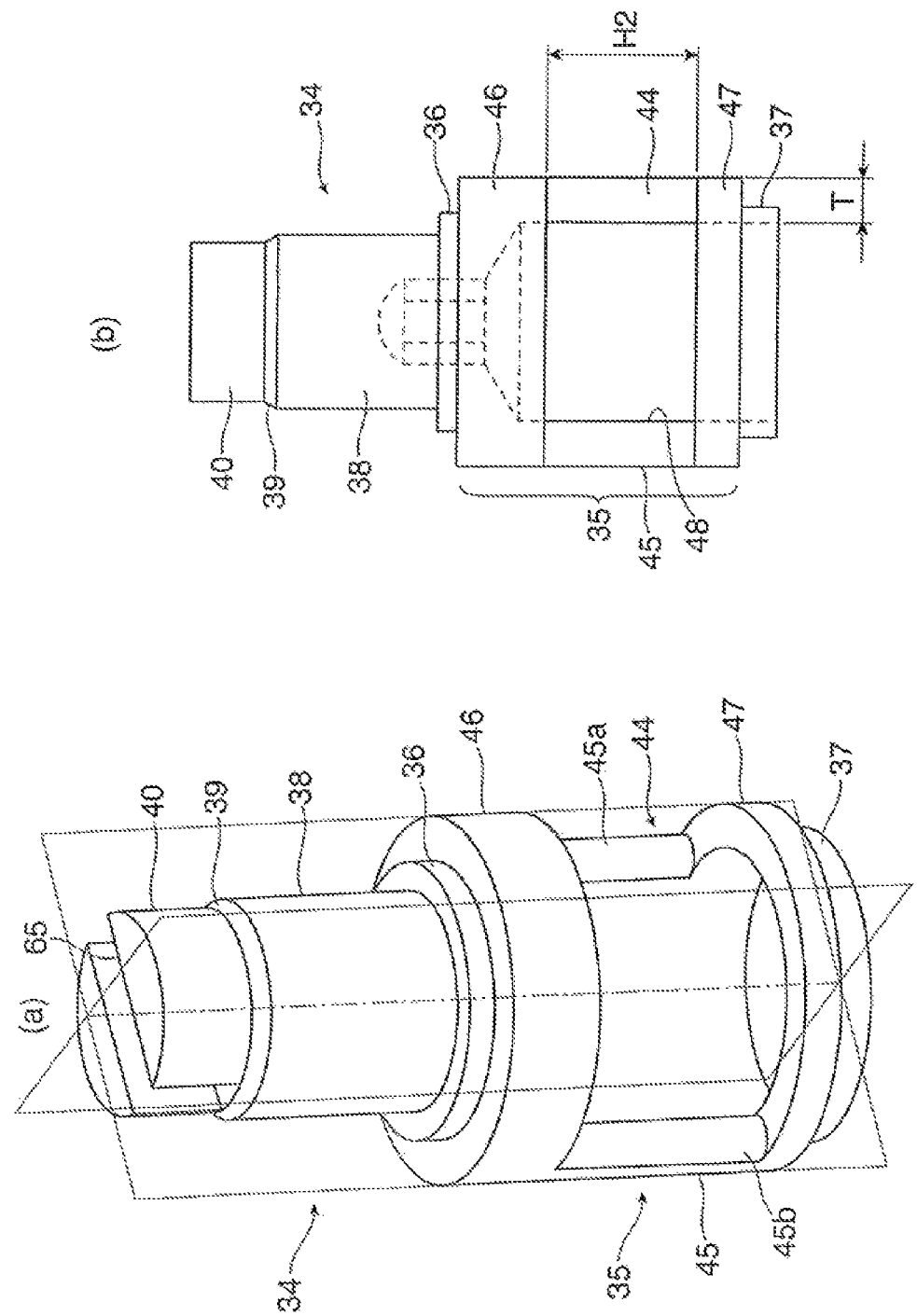
FIG. 22 are configuration views for illustrating the valve shaft.

As illustrated in FIG. 22, a valve shaft 34 as one example of the valve body has an outer shape obtained by forming metal, for example, SUS, into a substantially columnar shape. The valve shaft 34 mainly includes a valve body portion 35, upper and lower shaft support parts 36 and 37, a sealing portion 38, and a coupling portion 40, which are integrally provided. The valve body portion 35 functions as a valve body. The upper and lower shaft support parts 36 and 37 are provided above and below the valve body portion 35, respectively, and support the valve shaft 34 in a freely rotatable manner. The sealing portion 38 is provided to an upper portion of the upper shaft support portion 36. The coupling portion 40 is provided to an upper portion of the sealing portion 38 through intermediation of a tapered portion 39.

The upper and lower shaft support parts 36 and 37 each have a cylindrical shape having an outer diameter smaller than that of the valve body portion 35 and having an equal or a different diameter. A length of the lower shaft support portion 37 in an axial direction is set to be slightly larger than that of the upper shaft support portion 36. As illustrated in FIG. 11, the lower shaft support portion 37 is supported in a freely rotatable manner through intermediation of a bearing 41 by a lower end of the valve seat 8 provided to the valve main body 6. An annular support portion 42 supporting the bearing 41 is provided at a lower portion of the valve seat 8 so as to protrude toward an inner periphery. The bearing 41, the support portion 42, and the third valve port 26 are set to have an equal inner diameter, and are configured to allow inflow of the fluid for temperature control to an inside of the valve body portion 35 with little resistance. Meanwhile, a thrust washer 43 is mounted to the upper shaft support portion 36 to reduce a load generated by the valve shaft 34 pressed by a sealing case 53 to be described later.

Further, as illustrated in FIG. 11 and FIG. 22 (b), the valve body portion 35 has a cylindrical shape having an opening formed therein. The opening 44 has a substantially half-cylindrical shape with an opening height H2, which is smaller than an opening height H1 of the first and second valve ports 9 and 18. A valve operating portion 45 having the opening 44 of the valve body portion 35 has a half-cylindrical shape (substantially half-cylindrical shape of a cylindrical portion excluding the opening 44) with a predetermined central angle α (for example, about) 190°. The valve operating portion 45 is arranged in a freely rotatable manner in the valve seat 8 and held in non-contact with an inner peripheral surface of the valve seat 8 through a slight gap to prevent metal-to-metal biting. Accordingly, with the valve body portion 35 positioned above and below the opening 44 included, the valve operating portion 45 simultaneously switches the first valve port 9 from a closed state to an opened state and the second valve port 18 from an opened state to a closed state in a reverse direction. As illustrated in FIG. 22, upper and lower valve shaft parts 46 and 47 arranged above and below the valve operating portion 45 each have a cylindrical shape having an outer diameter equal to that of the valve operating portion 45, and are held in non-contact with the inner peripheral surface of the valve seat 8 in a freely rotatable manner through a slight gap. In an inside over the valve operating portion 45, the upper and lower valve shaft parts 46 and 47, and the sealing portion 38, a space 48 is provided in a state of penetrating the valve shaft 34 toward a lower edge thereof. The space 48 has a columnar shape.

Further, a cross section of each of both end surfaces 45a and 45b of the valve operating portion 45 in a circumferential direction (rotation direction), which is taken along a direction intersecting (orthogonal to) the center axis C, has a curved-surface shape. More specifically, as illustrated in FIG. 22, the cross section of each of the both end portions 45a and 45b of the valve operating portion 45 in the circumferential direction, which is taken along a direction intersecting the rotation axis C, has an arc shape being convex toward the opening 44. A curvature radius of each of the both end portions 45a and 45b is set to, for example, a half of a thickness T of the valve operating portion 45. As a result, a cross section of each of the both end portions 45a and 45b is a semicircular shape.

Figure 23:
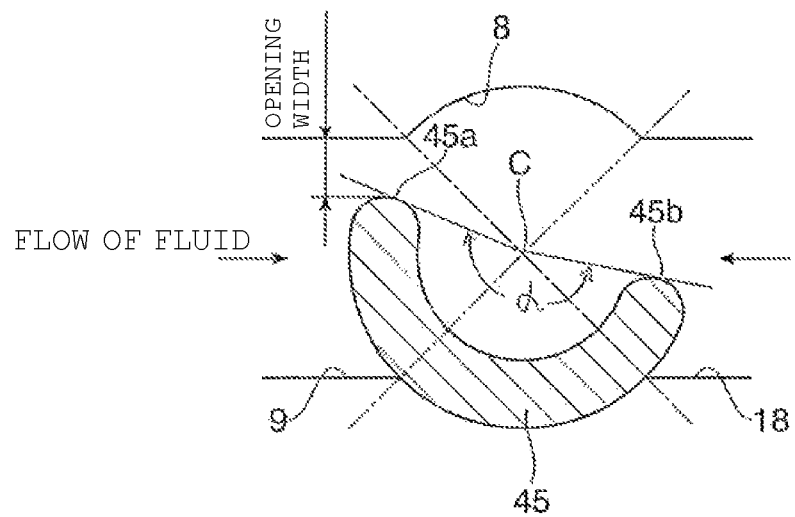
FIG. 23 are configuration views for illustrating the valve shaft.
Figure 23:
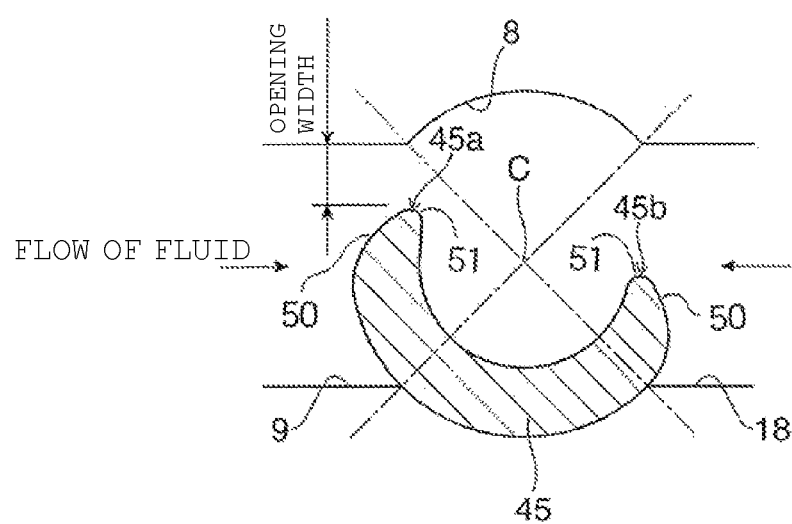

The cross section of each of the both end portions 45a and 45b of the valve operating portion 45 in the circumferential direction, which is taken along a direction intersecting the rotation axis C, is not limited to an arc shape. Each of the both end surfaces 45*a* and 45*b* in the circumferential direction (rotation direction) may have a curved-surface shape. As illustrated in FIG. 23(*b*), the cross section of each of the both end portions 45*a* and 45*b* of the valve operating portion 45 in the circumferential direction, which is taken along a direction intersecting the rotation axis C, may have a curved shape obtained by smoothly connecting a first curved portion 50, which is positioned on an outer peripheral side, and a second curved portion 51, which is positioned on an inner peripheral side and has a curvature radius smaller than that of the first curved portion 50.

As illustrated in FIG. 23, when the valve shaft 34 is driven to rotate to open and close the first and second valve ports 9 and 18, in flows of the fluid, the both end portions 45*a* and 45*b* of the valve operating portion 45 in the circumferential direction are moved (rotated) so as to protrude from or retreat to the ends of the first and second valve ports 9 and 18 in the circumferential direction. Accordingly, the first and second valve ports 9 and 18 are switched from the opened state to the closed state, or from the closed state to the opened state. At this moment, it is desired that each of the both end portions 45*a* and 45*b* of the valve operating portion 45 in the circumferential direction have a cross section having a curved-surface shape so as to further linearly change opening areas of the first and second valve ports 9 and 18 with respect to a rotation angle of the valve shaft 34.

Figure 24:
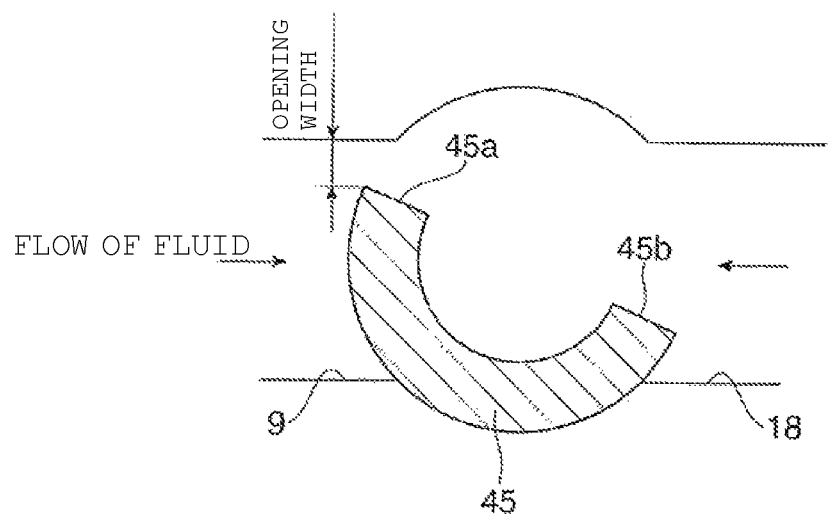
FIG. 24 are configuration views for illustrating the valve shaft.
Figure 24:
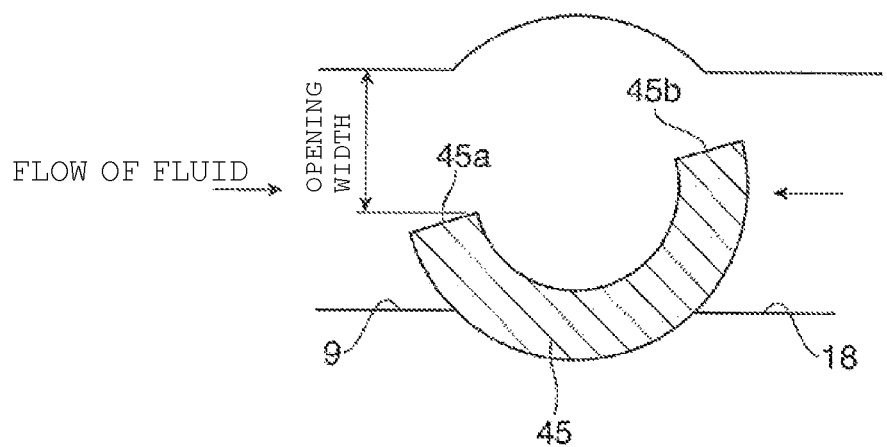

Further, the both end portions 45*a* and 45*b* of the valve operating portion 45 in the circumferential direction is not limited thereto. As illustrated in FIG. 24, the both end portions 45*a* and 45*b* may each have a flat-surface shape in a radial direction of the valve operating portion 45. Even in a case where each of the both end portions 45*a* and 45*b* of the valve operating portion 45 in the circumferential direction has the flat-surface shape, the opening areas of the first and second valve ports 9 and 18 with respect to the rotation angle of the valve shaft 34 can be substantially linearly changed.

As illustrated in FIG. 11, the sealing portion 4 is configured to seal the valve shaft 34 in a liquid-tight state. The sealing portion 4 has the sealing case 53 obtained by forming metal, for example, SUS, into a cylindrical shape. The sealing portion 4 has an insertion through hole 52 through which the valve shaft 34 is inserted. As illustrated in FIG. 14, the sealing case 53 is arranged in a recessed portion 54 that is formed in an upper end surface of the valve main body 6 and has a columnar shape. The sealing case 53 has such structure that a positional relationship between the sealing case 53 and the valve shaft 34 is determined through annular sealing members 55 and 56 and that the sealing case 53 is fixed through a positioning pin 58 (see FIG. 13) so as to be prevented from rotating with respect to a spacer member 59 to be described later. On an inner peripheral surface of the sealing case 53, the two annular sealing members 55 and 56 formed of, for example, O-rings for sealing the valve shaft 34 are arranged in a vertical direction. As the sealing members 55 and 56, for example, an O-ring made of ethylene-propylene rubber (EPDM) is used. The upper sealing member 56 is retained by a retaining member 56*a*. Further, the annular sealing member 57 formed of, for example, an O-ring seals the sealing case 53 with respect to the valve main body 6.

The coupling portion 5 is arranged between the valve main body 6, in which the sealing portion 4 is provided, and the actuator 3. The coupling portion 5 is configured to connect the valve shaft 34 and a rotation shaft (not shown), which allows the valve shaft 34 to be integrally rotated, to each other. The coupling portion 5 includes a spacer member 59, an adaptor plate 60, and a coupling member 62. The spacer member 59 is arranged between the sealing portion 4 and the actuator 3. The adaptor plate 60 is fixed to an upper portion of the spacer member 59. The coupling member 62 is accommodated in a space 61 having a columnar shape formed in a state of penetrating an inside of the spacer member 59 and the adaptor plate 60, and connects the valve shaft 34 and the rotation shaft (not shown) to each other. The spacer member 59 is obtained by forming metal, for example, SUS, into a rectangular tube shape, which has substantially the same shape in plan view as that of the valve main body 6 and a relatively small height. The spacer member 59 is fixed to both the valve main body 6 and the adaptor plate 60 through means such as screw fastening. Further, as illustrated in FIG. 10 (*c*), the adaptor plate 60 is obtained by forming metal, for example, SUS, into a plate-like shape having a planar polygonal shape. The adaptor plate 60 is mounted to the base 64 of the actuator 3 in a fixed state with hexagon socket head cap screws 63.

As illustrated in FIG. 11, the coupling member 62 is obtained by forming, for example, metal, a synthetic resin having heat resistance, or ceramics into a columnar shape. A recessed groove 65 is formed so as to penetrate an upper end of the valve shaft 34 in a horizontal direction. The valve shaft 34 is coupled and fixed to the coupling member 62 by fitting a projecting portion 66 of the coupling member 62 into the recessed groove 65. Meanwhile, a recessed groove 67 is formed in an upper end of the coupling member 62 so as to penetrate the coupling member 62 in a horizontal direction. The rotation shaft (not shown) is coupled and fixed to the coupling member 62 by fitting a projecting portion (not shown) into the recessed groove 67 of the coupling member 62. The spacer member 59 has an opening 68 formed in a side surface thereof for detecting leakage of a liquid through the insertion through hole 52 when the liquid leaks from the sealing members 55 and 56. The opening 68 is set to, for example, Rc ⅟₁₆ being a standard for a tapered female thread having a bore diameter of about 8 mm.

As illustrated in FIG. 10, the actuator 3 includes the base 64 having a planar surface having a rectangular shape. A casing 90 is mounted to an upper portion of the base 64 with screws 91. The casing 90 is constructed as a box body having a rectangular parallelepiped shape, which contains drive means including a stepping motor, an encoder, and the like. The drive means in the actuator 3 only needs to be capable of rotating the rotation shaft (not shown) in a desired direction with predetermined accuracy based on control signals, and configuration thereof is not limited. The drive means includes a stepping motor, a driving force transmission mechanism, and an angle sensor. The driving force transmission mechanism is configured to transmit a rotational driving force of the stepping motor to the rotation shaft through intermediation of driving force transmission means, for example, a gear. The angle sensor is, for example, an encoder or the like configured to detect a rotation angle of the rotation shaft.

In FIG. 10, a reference symbol 92 denotes a stepping motor-side cable, and a reference symbol 93 denotes an angle sensor-side cable. The stepping motor-side cable 92 and the angle sensor-side cable 93 are connected to a control device (not shown) configured to control the three-way motor valve 1.

<Operation of Three-way Motor Valve>

In the three-way motor valve 1 according to the embodiment of the present invention, the flow rate of the fluid is controlled as follows.

As illustrated in FIG. 16, at the time of assembly or adjustment for use, in the three-way motor valve 1, the first flange member 10 and the second flange member 19 are once removed from the valve main body 6 so that the adjusting rings 77 and 87 are exposed to the outside. Under this state, when the fastening amounts of the adjusting rings 77 and 87 with respect to the valve main body 6 are adjusted through use of the jig (not shown), as illustrated in FIG. 18, the protruding amounts of the first valve seat 70 and the second valve seat 80 from the valve seat 8 of the valve main body 6 are changed. When the fastening amounts of the adjusting rings 77 and 87 with respect to the valve main body 6 are increased, the concave portions 74 of the first valve seat 70 or the concave portion 84 of the second valve seat 80 protrudes from the inner peripheral surface of the valve seat 8 of the valve main body 6 so that the gap G1 between the outer peripheral surface of the valve shaft 34 and the concave portion 74 of the first valve seat 70 or the concave portion 84 of the second valve seat 80 is reduced. Accordingly, the outer peripheral surface of the valve shaft 34 is brought into contact with the concave portion 74 of the first valve seat 70 or the concave portion 84 of the second valve seat 80. Meanwhile, when the fastening amounts of the adjusting rings 77 and 87 with respect to the valve main body 6 are reduced, a protruding length of the concave portion 74 of the first valve seat 70 or the concave portion 84 of the second valve seat 80 from the inner peripheral surface of the valve seat 8 of the valve main body 6 is reduced so that the gap G1 between the outer peripheral surface of the valve shaft 34 and the concave portion 74 of the first valve seat 70 or the concave portion 84 of the second valve seat 80 is increased.

In the first embodiment of the present invention, the gap G1 between the outer peripheral surface of the valve shaft 34 and the concave portion 74 of the first valve seat 70 or the concave portion 84 of the second valve seat 80 is set to be smaller than 10 μm. However, the gap G1 between the outer peripheral surface of the valve shaft 34 and the concave portion 74 of the first valve seat 70 or the concave portion 84 of the second valve seat 80 is not limited to the above-mentioned value. The gap G1 may be set to a value smaller than the above-mentioned value, for example, may satisfy the gap G1=0 μm (contact state). Alternatively, the gap G1 may be set to 10 μm or more.

As illustrated in FIG. 11, in the three-way motor valve 1, the fluid flows in from the first flange member 10 and the second flange member 19 via pipes (not shown), and the fluid flows out from the third flange member 27 via a pipe (not shown). Further, as illustrated in FIG. 21(a), for example, in an initial state before start of operation, the three-way motor valve 1 is brought into a state in which the valve operating portion 45 of the valve shaft 34 simultaneously closes (completely closes) the first valve port 9 and opens (completely opens) the second valve port 18.

As illustrated in FIG. 11, in the three-way motor valve 1, when the stepping motor (not shown) provided in the actuator 3 is driven to rotate by a predetermined amount, the rotation shaft (not shown) is driven to rotate in accordance with a rotation amount of the stepping motor. In the three-way motor valve 1, when the rotation shaft is driven to rotate, the valve shaft 34 coupled and fixed to the rotation shaft is rotated by an angle equivalent to the rotation amount (rotation angle) of the rotation shaft. The valve operating portion 45 is rotated in the valve seat 8 along with the rotation of the valve shaft 34. With this, as illustrated in FIG. 23 (a), the one end portion 45a of the valve operating portion 45 in the circumferential direction gradually opens the first valve port 9. As a result, the fluid flows into the valve seat 8 from a first housing member 10 through the first inflow port 7, and flows out through the outflow port 26.

At this time, as illustrated in FIG. 23 (a), another end portion 45b of the valve operating portion 45 in the circumferential direction opens the second valve port 18. Thus, the fluid having flowed in through the first inflow port 7 and the second inflow port 18 flows into the valve seat 8 and is distributed in accordance with a rotation amount of the valve shaft 34, and flows out from a third housing member 31 through the outflow port 26.

As illustrated in FIG. 23 (a), in the three-way motor valve 1, when the valve shaft 34 is driven to rotate, and one end portion 45a of the valve operating portion 45 in the circumferential direction gradually opens the first valve port 9, the fluid flows through the valve seat 8 and the valve shaft 34, and is supplied to the outside through the outflow port 26.

Further, in the three-way motor valve 1, each of the both end portions 45a and 45b of the valve operating portion 45 in the circumferential direction has a cross section having a curved-surface shape or a flat-surface shape. Thus, the opening areas of the first and second valve ports 9 and 18 can be linearly changed with respect to the rotation angle of the valve shaft 34. Further, it is conceivable that the fluid regulated in flow rate by the both end portions 45a and 45b of the valve operating portion 45 flow in a form of a nearly laminar flow. Therefore, the mixture ratio (flow rate) between the fluid can be controlled with high accuracy in accordance with the opening areas of the first valve port 9 and the second valve port 18.

In the three-way motor valve 1 according to the first embodiment of the present invention, as described above, under an initial state, the valve operating portion 45 of the valve shaft 34 simultaneously closes (completely closes) the first valve port 9 and opens (completely opens) the second valve port 18.

At this time, in the three-way motor valve 1, when the valve operating portion 45 of the valve shaft 34 closes (completely closes) the first valve port 9, ideally, the flow rate of the fluid should be zero.

However, as illustrated in FIG. 18, in the three-way motor valve 1, in order to prevent metal-to-metal biting of the valve shaft 34 into the inner peripheral surface of the valve seat 8, the valve shaft 34 is provided in a freely rotatable manner so as to be held in non-contact with the valve seat 8 with a slight gap between the outer peripheral surface of the valve shaft 34 and the inner peripheral surface of the valve seat 8. As a result, the slight gap G2 is defined between the outer peripheral surface of the valve shaft 34 and the inner peripheral surface of the valve seat 8. Accordingly, in the three-way motor valve 1, even when the valve operating portion 45 of the valve shaft 34 closes (completely closes) the first valve port 9, the flow rate of the fluid does not become zero, and a small amount of the fluid flows to the second valve port 18 side through the slight gap G2 defined between the outer peripheral surface of the valve shaft 34 and the inner peripheral surface of the valve seat 8.

Incidentally, in the three-way motor valve 1 according to the first embodiment of the present invention, as illustrated in FIG. 18, the first valve seat 70 and the second valve seat 80 include the concave portion 74 and the concave portion 84, respectively. The concave portion 74 or the concave portion 84 protrudes from the inner peripheral surface of the valve seat 8 toward the valve shaft 34 side, thereby partially reducing the gap G1 between the outer peripheral surface of the valve shaft 34 and the inner peripheral surface of the valve seat 8.

Therefore, in the three-way motor valve 1, in order to prevent metal-to-metal biting of the valve shaft 34 into the inner peripheral surface of the valve seat 8, even when the valve shaft 34 is provided in a freely rotatable manner so as to be held in non-contact with the valve seat 8 with the slight gap between the outer peripheral surface of the valve shaft 34 and the inner peripheral surface of the valve seat 8, inflow of the fluid through the first valve port 9 into the slight gap G2 defined between the outer peripheral surface of the valve shaft 34 and the inner peripheral surface of the valve seat 8 is significantly restricted and suppressed by the gap G1 that is a region corresponding to a partially reduced gap between the outer peripheral surface of the valve shaft 34 and the inner peripheral surface of the valve seat 8.

Accordingly, the three-way motor valve 1 can significantly suppress leakage of the fluid when the three-way motor valve 1 completely closes the valve port as compared to a three-way motor valve that does not include the concave portions 74 and 84 formed to partially reduce the gap between the valve shaft 34 and the first valve seat 70, which is opposed to the valve shaft 34, and the gap between the valve shaft 34 and the second valve seat 80, which is opposed to the valve shaft 34.

Preferably, the three-way motor valve 1 according to the first embodiment of the present invention can significantly reduce the gaps G1 and G2 through contact of the concave portion 74 of the first valve seat 70 and the concave portion 84 of the second valve seat 80 with the outer peripheral surface of the valve shaft 34, thereby significantly suppressing leakage of the fluid when the three-way motor valve 1 completely closes the valve port.

Further, similarly, the three-way motor valve 1 can significantly suppress leakage and outflow of the fluid through the second valve port 18 to another first valve port 9 side even when the valve operating portion 45 of the valve shaft 34 closes (completely closes) the second valve port 18.

Moreover, as illustrated in FIG. 11, in the first embodiment of the present invention, the first pressure applying portion 94 and the second pressure applying portion 96 are respectively provided to the surface 70a of the first valve seat 70 and the surface 80a of the second valve seat 80 that are opposite to the valve shaft 34. The first pressure applying portion 94 and the second pressure applying portion 96 are configured to apply the pressure of the fluid through the slight gap between the outer peripheral surface of the valve shaft 34 and the inner peripheral surface of the valve seat 8. Accordingly, as illustrated in FIG. 21(*a*), in the three-way motor valve 1, under a state in which an opening degree is 0%, that is, the first valve port 9 is nearly completely closed, and under a state in which the opening degree is 100%, that is, the first valve port 9 is nearly completely opened, when the first valve port 9 and the second valve port 18 are each brought closer to a completely closed state, an amount of outflow of the fluid through the first valve port 9 and the second valve port 18 is significantly reduced. Along with this, in the three-way motor valve 1, in the valve port brought closer to a completely closed state, the pressure of the fluid flowing out through the first valve port 9 or the second valve port 18 is reduced. Thus, for example, when the opening degree is 0%, that is, the first valve port 9 is completely closed, the fluid having a pressure of about 700 KPa flows in through the inflow port 26, and then flows out through the second valve port 18 while maintaining the pressure of about 700 KPa. At this time, on the side of the first valve port 9 that is nearly completely closed, a pressure on an outflow side is reduced to, for example, about 100 KPa. As a result, there is a difference in pressure of about 600 KPa between the second valve port 18 and the first valve port 9.

Therefore, in the three-way motor valve 1 against which no countermeasures are taken, due to the difference in pressure between the second valve port 18 and the first valve port 9, the valve shaft 34 is moved (displaced) to the side of the first valve port 9 under a relatively low pressure so that the valve shaft 34 is held in unbalanced contact with the bearing 41. As a result, there is a fear in that driving torque is increased when the valve shaft 34 is driven to rotate in a direction of closing the valve shaft 34, thereby causing operation malfunction.

Figure 25:
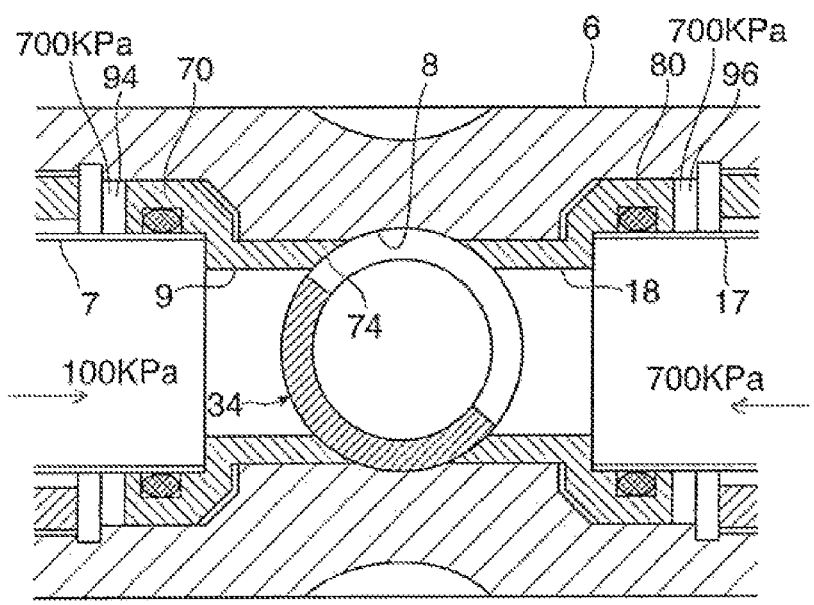
FIG. 25 is a sectional configuration view for illustrating a motion of the three-way motor valve as one example of the three-way valve for flow rate control according to the first embodiment of the present invention.

In contrast, in the three-way motor valve 1 according to the first embodiment of the present invention, as illustrated in FIG. 25, the first pressure applying portion 94 and the second pressure applying portion 96 are respectively provided to the surface of the first valve seat 70 and the surface of the second valve seat 80 that are opposite to the valve shaft 34. The first pressure applying portion 94 and the second pressure applying portion 96 are configured to apply, to the first valve seat 70 and the second valve seat 80, the pressure of the fluid leaking through the slight gap between the outer peripheral surface of the valve shaft 34 and the inner peripheral surface of the valve seat 8. Thus, in the three-way motor valve 1 according to the first embodiment of the present invention, even when there is a difference in pressure between the second valve port 18 and the first valve port 9, a relatively high pressure of the fluid is applied to the first pressure applying portion 94 and the second pressure applying portion 96 through the slight gap between the outer peripheral surface of the valve shaft 34 and the inner peripheral surface of the valve seat 8. As a result, owing to the relatively high pressure of the fluid of about 100 KPa, which is applied to the first pressure applying portion 94, the first valve seat 70 under a relatively low pressure of about 100 KPa is operated so as to restore the valve shaft 34 to a proper position. Therefore, the three-way motor valve 1 according to the first embodiment of the present invention can prevent and suppress the valve shaft 34 from being moved (displaced) to the side of the first valve port 9 under a relatively low pressure due to the difference in pressure between the second valve port 18 and the first valve port 9, can keep a state in which the valve shaft 34 is smoothly supported by the bearing 41, and can prevent and suppress an increase in driving torque when the valve shaft 34 is driven to rotate in the direction of closing the valve shaft 34.

Further, the three-way motor valve 1 according to the first embodiment of the present invention similarly operates also under a state in which the first valve port 9 is nearly completely opened, that is, the second valve port 18 is nearly completely closed, and thus can prevent and suppress the increase in driving torque when the valve shaft 34 is driven to rotate.

Figure 26:
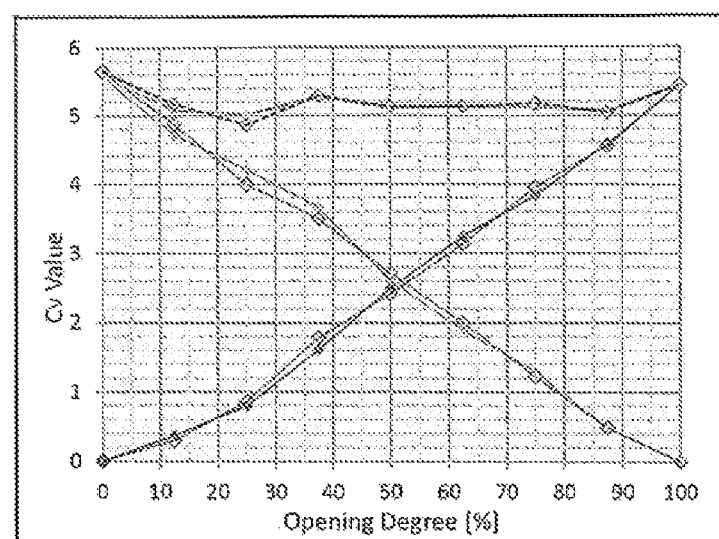
FIG. 26 are graphs for showing characteristics of the motion of the three-way motor valve as one example of the three-way valve for flow rate control according to the first embodiment of the present invention.
Figure 26:
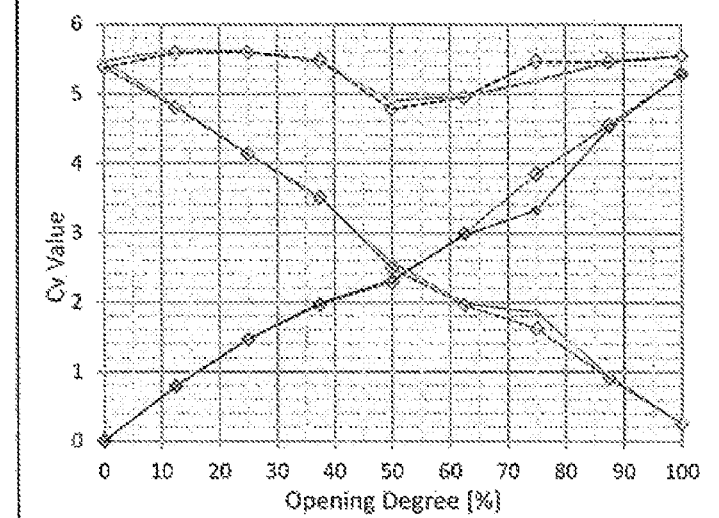

FIG. 26 are graphs for showing measurement values of flow coefficients of fluids flowing into the valve through the first and second inflow ports, and measurement values of a flow coefficient of a fluid flowing out of the valve through the outflow port with respect to the opening degree of the valve shaft 34 of the three-way motor valve 1. FIG. 26(*a*) is a graph for showing characteristics when the three-way motor valve 1 is used as the first three-way valve 103 for flow rate control for mixture, and FIG. 26(*b*) is a graph for showing characteristics when the three-way motor valve 1 is used as the second three-way valve 108 for flow rate control for distribution. Further, when the three-way motor valve 1 is used as the second three-way valve 108 for flow rate control for distribution, the outflow port serves as the inflow port, and the first and second inflow ports serve as the first and second outflow ports, respectively. In FIG. 26, the pressure of the fluid flowing into the valve through the first inflow port 7 and the pressure of the fluid flowing into the valve through the second inflow port 18 are set to an equal value.

Incidentally, in the three-way motor valve 1 configured as described above, a flow coefficient Cv value is calculated by the following relational expression. Here, V, G, and ΔP represent a flow rate of a fluid (1/min), specific gravity of the fluid (specific gravity of water is equal to one), and a differential pressure (kPa), respectively.

$$C_v = 0.709 \times V \times \sqrt{\frac{G}{\Delta P}} \quad \text{[Relational Expression 1]}$$

When the three-way motor valve 1 is used as the first three-way valve 103 for flow rate control for mixture, the differential pressure ΔP represents a difference between the pressure at the first inflow port 7 and the pressure at the outflow port 26, and a difference between the pressure at the second inflow port 18 and the pressure at the outflow port 26. Accordingly, the flow coefficient Cv value of the three-way motor valve 1 varies between a case in which there is the difference in pressure between the first inflow port 7 and the second inflow port 18 and a case in which there is no difference in pressure therebetween.

In the three-way motor valve 1, when the flow rate at the first inflow port 7 and the flow rate at the second inflow port 18 are substantially equal, it can be considered that the pressure at the first inflow port 7 and the pressure at the second inflow port 18 are substantially equal. However, when the opening degree of the valve shaft 34 of the three-way motor valve 1 is deviated from 50%, the flow rate at the first inflow port 7 and the flow rate at the second inflow port 18 differ from each other. As a result, it cannot be considered that the pressure at the first inflow port 7 and the pressure at the second inflow port 18 are substantially equal. Thus, the three-way motor valve 1 has the difference in pressure between the first inflow port 7 and the second inflow port 18, with the result that characteristics of the flow coefficient Cv value vary. Thus, in the three-way motor valve 1, in accordance with the opening degree of the valve shaft 34, the pressure at the first inflow port 7 and the pressure at the second inflow port 18 differ from each other, and the flow coefficient Cv value is deviated from the values shown in FIG. 26. Accordingly, when the three-way motor valve 1 is used as, for example, the first three-way valve 103 for flow rate control for mixture, in accordance with the opening degree of the valve shaft 34, the pressure at the first inflow port 7 and the pressure at the second inflow port 18 differ from each other, and the mixture ratio between the lower temperature fluid and the higher temperature fluid differs from the flow coefficient Cv values shown in FIG. 26.

According to studies conducted by the inventor of the present invention, as described above, the flow rate of the fluid flowing through the three-way motor valve 1 depends on the flow coefficient Cv value. However, when the pressure at the first inflow port 7 and the pressure at the second inflow port 18 differ from each other, it is apparent that the flow coefficient Cv value varies, and that a target mixture ratio between the lower temperature fluid and the higher temperature fluid cannot be obtained.

Therefore, in the embodiment of the present invention, as illustrated in FIG. 8, in a case in which the three-way motor valve 1 is used as the first three-way valve 103 for flow rate control for mixture, even when, in accordance with the opening degree of the valve shaft 34 of the first three-way valve 103 for flow rate control, the flow rates of the lower temperature fluid and the higher temperature fluid flowing into the valve through the first inflow port 7 and the second inflow port 18 differ from each other and the pressure at the first inflow port 7 and the pressure at the second inflow port 18 differ from each other, the mixture ratio between the lower temperature fluid and the higher temperature fluid mixed together by the first three-way valve 103 for flow rate control can be brought closer to a desired value.

Figure 27:
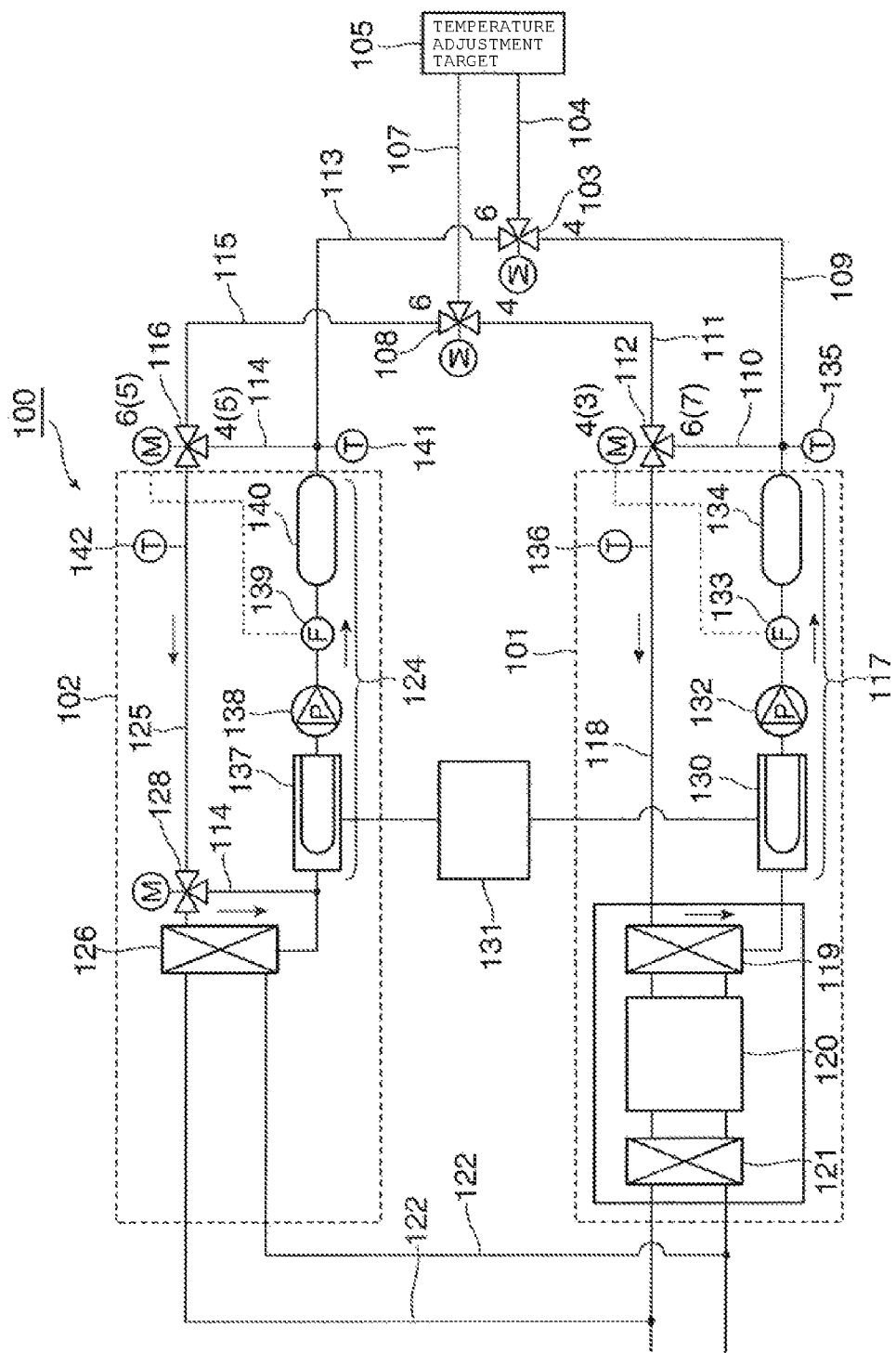
FIG. 27 is a piping configuration diagram for illustrating the operation of the constant-temperature maintaining device (chiller device) as the temperature control device according to the first embodiment of the present invention.

Further, in the embodiment of the present invention, as illustrated in FIG. 27, the chiller device 100 is configured to, in accordance with the opening degree of the valve shaft 34 of the first three-way valve 103 for flow rate control formed of the three-way motor valve 1, independently control the opening degree of the valve shaft 34 of at least one of the third and fourth three-way valves 112 and 116 for flow rate control, which are each formed of the three-way motor valve 1 similarly.

That is, as illustrated in FIG. 27, for example, when the mixture ratio between the lower temperature fluid and the higher temperature fluid in the first three-way valve 103 for flow rate control is 4:6, the fourth three-way valve 116 for flow rate control basically controls a ratio (flow rate ratio) between the higher temperature fluid returned to the higher temperature fluid supply portion 102 through the second bypass pipe 114 and the fluid for temperature control distributed by the second three-way valve 108 for flow rate control to the higher temperature fluid supply portion 102 to 4:6.

In contrast, in the embodiment of the present invention, even when the mixture ratio between the higher temperature fluid and the lower temperature fluid in the first three-way valve 103 for flow rate control is 6:4, the fourth three-way valve 116 for flow rate control is configured to, without controlling the ratio (flow rate ratio) between the higher temperature fluid returned to the higher temperature fluid supply portion 102 through the second bypass pipe 114 and the fluid for temperature control distributed by the second three-way valve 108 for flow rate control to the higher temperature fluid supply portion 102 to 4:6, control the ratio to, for example, 5:5 by performing control so as to reduce a ratio (flow rate ratio) of the fluid for temperature control distributed by the second three-way valve 108 for flow rate control to the higher temperature fluid supply portion 102.

Similarly, in the embodiment of the present invention, even when the mixture ratio between the higher temperature fluid and the lower temperature fluid in the first three-way valve 103 for flow rate control is 4:6, the third three-way valve 112 for flow rate control is configured to, without controlling the ratio (flow rate ratio) between the higher temperature fluid returned to the higher temperature fluid supply portion 102 through the second bypass pipe 114 and the fluid for temperature control distributed by the second three-way valve 108 for flow rate control to the higher temperature fluid supply portion 102 to 6:4, control the ratio to, for example, 7:3 by performing control so as to reduce a ratio (flow rate ratio) of the fluid for temperature control distributed by the second three-way valve 108 for flow rate control to the higher temperature fluid supply portion 102.

In this manner, in the embodiment of the present invention, in a case in which the three-way motor valve 1 is used as the first three-way valve 103 for flow rate control for mixture, even when, in accordance with the opening degree of the valve body of the first three-way valve 103 for flow rate control, the flow rates of the lower temperature fluid and the higher temperature fluid flowing into the valve through the first inflow port 7 and the second inflow port 18 differ from each other and the pressure at the first inflow port 7 and the pressure at the second inflow port 18 differ from each other, the opening degree of the valve shaft 34 of the fourth three-way valve 116 for flow rate control is controlled to obtain not the ratio of 4:6, which is originally set, but the ratio of 5:5 in such a manner that the flow rate of the fluid flowing to a bypass side of the fourth three-way valve 116 for flow rate control is relatively increased, thereby reducing the ratio of the flow rate of the higher temperature fluid to be supplied to the first three-way valve 103 for flow rate control. As a result, the pressure of the higher temperature fluid to be supplied to the first three-way valve 103 for flow rate control is increased, thereby ensuring the flow rate of the higher temperature fluid to be supplied to the first three-way valve 103 for flow rate control.

Similarly, in the embodiment of the present invention, even when the mixture ratio between the lower temperature fluid and the higher temperature fluid in the first three-way valve 103 for flow rate control is 4:6, without controlling the ratio (flow rate ratio) between the lower temperature fluid returned to the lower temperature fluid supply portion 101 through the first bypass pipe 110 and the fluid for temperature control distributed by the second three-way valve 108 for flow rate control to the lower temperature fluid supply portion 101 to 6:4, the third three-way valve 112 for flow rate control controls the ratio to, for example, 7:3 by performing control so as to reduce a ratio (flow rate ratio) of the fluid for temperature control distributed by the second three-way valve 108 for flow rate control, which is a main passage side, to the lower temperature fluid supply portion 101. As a result, the pressure of the lower temperature fluid to be supplied to the first three-way valve 103 for flow rate control is increased, thereby ensuring the flow rate of the lower temperature fluid to be supplied to the first three-way valve 103 for flow rate control.

Therefore, in the chiller device 100, in a case in which the three-way motor valve 1 is used as the first three-way valve 103 for flow rate control for mixture, even when, in accordance with the opening degree of the valve body of the first three-way valve 103 for flow rate control, the pressures of the lower temperature fluid and the higher temperature fluid flowing into the valve through the first inflow port 7 and the second inflow port 18 differ from each other and the flow rates of the lower temperature fluid and the higher temperature fluid differ from the predetermined flow coefficient Cv values, the opening degree of the valve shaft 34 of each of the third and fourth three-way valves 112 and 116 for flow rate control is changed from the original value, thereby ensuring the pressures of the lower temperature fluid and the higher temperature fluid flowing into the valve through the first inflow port 7 and the second inflow port 18. Thus, a desired mixture ratio between the lower temperature fluid and the higher temperature fluid is obtained, thereby being capable of controlling the temperature of the temperature control target with excellent accuracy.

INDUSTRIAL APPLICABILITY

The present invention is capable of controlling a mixture ratio between the lower temperature fluid and the higher temperature fluid with excellent accuracy, and is capable of controlling control temperatures for a temperature control target in a plurality of steps.

REFERENCE SIGNS LIST

100 . . . temperature control device
101 . . . lower temperature fluid supply portion
102 . . . higher temperature fluid supply portion
103 . . . first three-way valve for flow rate control
105 . . . temperature adjustment target device
108 . . . second three-way valve for flow rate control
112 . . . third three-way valve for flow rate control
116 . . . fourth three-way valve for flow rate control

The invention claimed is:

1. A temperature control device, comprising:
   first supply means for supplying a lower temperature fluid adjusted to a first predetermined lower temperature;
   second supply means for supplying a higher temperature fluid adjusted to a second predetermined higher temperature;
   a first three-way valve for flow rate control configured to mix the lower temperature fluid supplied from the first supply means and the higher temperature fluid supplied from the second supply means while controlling a flow rate of the lower temperature fluid and a flow rate of the higher temperature fluid to form a fluid for temperature control and then supply the lower temperature fluid and the higher temperature fluid to a temperature control target;
   a second three-way valve for flow rate control configured to distribute the fluid for temperature control having flowed through the temperature control target to the first supply means and the second supply means while controlling a flow rate of the fluid for temperature control;
   a third three-way valve for flow rate control configured to control the flow rate of the fluid for temperature control, which flows through the temperature control target and is distributed by the second three-way valve for flow rate control to the first supply means, and the flow rate of the lower temperature fluid, which is prevented from being supplied from the first supply means to the first three-way valve for flow rate control and is returned to the first supply means;
   a fourth three-way valve for flow rate control configured to control the flow rate of the fluid for temperature control, which flows through the temperature control target and is distributed by the second three-way valve for flow rate control to the second supply means, and the flow rate of the higher temperature fluid, which is prevented from being supplied from the second supply means to the first three-way valve for flow rate control and is returned to the second supply means,
   wherein the first to fourth three-way valves for flow rate control each include:
      a valve main body including a valve seat, the valve seat having a columnar space and having a first valve port, which allows outflow of a fluid and has a rectangular cross section, and a second valve port, which allows outflow of the fluid and has a rectangular cross section;
      first and second valve port forming members, which are fitted to the valve main body and form the first valve port and the second valve port, respectively;
      a valve body being provided in a freely rotatable manner in the valve seat of the valve main body so as to simultaneously switch the first valve port from a closed state to an opened state and switch the second valve port from an opened state to a closed state, the valve body having a cylindrical shape and having an opening;

a pressure applying portion configured to apply a pressure of the fluid leaking through a gap between the valve body and the valve seat to the first and second valve port forming members so as to suppress shift of a position of the valve body when the valve body opens and closes the first valve port and the second valve port; and drive means for driving the valve body to rotate.

2. The temperature control device according to claim 1, wherein the first supply means includes:

first cooling means for cooling the fluid for temperature control returned to the first supply means;

first heating means for heating in an auxiliary manner the fluid for temperature control cooled by the first cooling means, and supplying the fluid for temperature control as the lower temperature fluid; and a first storage tank configured to store the lower temperature fluid heated in an auxiliary manner by the first heating means.

3. The temperature control device according to claim 1 or claim 2, wherein the second supply means includes:

second cooling means for cooling the fluid for temperature control returned to the second supply means;

second heating means for heating in an auxiliary manner the fluid for temperature control cooled by the second cooling means, and supplying the fluid for temperature control as the higher temperature fluid; and a second storage tank configured to store the higher temperature fluid heated in an auxiliary manner by the second heating means.

4. The temperature control device according to claim 1 or 2, wherein, in accordance with a mixture ratio in the first three-way valve for flow rate control, the third three-way valve for flow rate control increases a ratio of the lower temperature fluid to be supplied from the first supply means and returned to the first supply means, and the fourth three-way valve for flow rate control increases a ratio of the higher temperature fluid to be supplied from the second supply means and returned to the second supply means.

\* \* \* \* \*